United States Patent [19]
Kaplan et al.

[11] Patent Number: 6,096,567
[45] Date of Patent: Aug. 1, 2000

[54] METHOD AND APPARATUS FOR DIRECT PROBE SENSING

[75] Inventors: Russell Kaplan, Sunnyvale; Ralph Scherp, Cupertino, both of Calif.

[73] Assignee: Electroglas, Inc., Santa Clara, Calif.

[21] Appl. No.: 08/980,595

[22] Filed: Dec. 1, 1997

[51] Int. Cl.⁷ .................................................. H01L 21/66
[52] U.S. Cl. .............................. 438/14; 438/25; 438/16; 324/758
[58] Field of Search ................................. 438/14, 15, 16, 438/17, 18; 324/754, 755, 756, 757, 758

[56] References Cited

U.S. PATENT DOCUMENTS

| | | | |
|---|---|---|---|
| 5,450,203 | 9/1995 | Penkethman | 356/373 |
| 5,644,245 | 7/1997 | Saitoh et al. | 324/754 |
| 5,654,204 | 8/1997 | Anderson | 438/15 |
| 5,657,394 | 8/1997 | Schwartz et al. | 382/151 |

*Primary Examiner*—Kevin M. Picardat
*Attorney, Agent, or Firm*—Blakley, Sokoloff, Taylor & Zafman

[57] ABSTRACT

An improved method and apparatus for automatically aligning a wafer prober to the bonding pads of a semiconductor device are provided. In one embodiment of one aspect of the invention, a pattern of contact electrodes is located using a low magnification image of a number of contact electrodes. A shape representative of a contact electrode point is then fitted to each of the number of contact electrodes using a high magnification image of the contact electrodes and a centroid of that fitted shape is determined. The position of the centroid is compared to the position of each of the number of pads, and the pads and contact electrodes are moved relative to each other to a position for contact between the pads and contact electrodes. Other aspects and other embodiments are also described.

16 Claims, 21 Drawing Sheets

| ζ | ψ+ | ψ- | X+ | X- | Y+ | Y- | C |
|---|---|---|---|---|---|---|---|
| 1.0 | $(M_{I,0})Y$ | $-(M_{I,0})Y$ | -1.0 | 1.0 | 0.0 | 0.0 | $(M_{I,0})X - (B_{I,0})X$ |
| 1.0 | $-(M_{I,1})Y$ | $(M_{I,1})Y$ | 1.0 | -1.0 | 0.0 | 0.0 | $-(M_{I,1})X - (B_{I,1})X$ |
| 1.0 | $(M_{I,2})X$ | $-(M_{I,2})X$ | 0.0 | 0.0 | -1.0 | 1.0 | $(M_{I,2})Y - (B_{I,2})Y$ |
| 1.0 | $-(M_{I,3})X$ | $(M_{I,3})X$ | 0.0 | 0.0 | 1.0 | -1.0 | $-(M_{I,3})Y - (B_{I,3})Y$ |

*FIG. 18*

METHOD AND APPARATUS FOR DIRECT PROBE SENSING

FIELD OF THE INVENTION

This invention relates to systems for probing devices having a plurality of locations designed to make electrical contact such as semiconductor devices. More particularly, this invention relates to automatically aligning a wafer prober to the bonding pads of a silicon integrated circuit device.

BACKGROUND OF THE INVENTION

Integrated circuits are often manufactured on a semiconductor substrate, such as a silicon wafer. The silicon wafer is typically a thin circular plate of silicon that is 150 or 200 millimeters in diameter and approximately 25 mils thick. A single wafer will have numerous devices which are integrated circuits and are imprinted on the wafer comprising a lattice of devices. Each device consists of numerous layers of circuitry and a collection of bonding pads. The bonding pads are small sites, typically 3 mils square, made usually with aluminum that eventually serve as the device's connections to the pin leads. Other than the bonding pads, the remainder of the wafer is coated with a final layer of an insulating material such as silicon nitride, called the passivation layer, which in many respects behaves like glass. The aluminum its;elf forms a thin non-conductive layer of aluminum oxide, which must be eliminated or broken through before good electrical contact can be made.

Since the packaging of a device is somewhat expensive, it is desirable to test a device before packaging to avoid packaging bad devices. This process of testing devices before packaging is referred to as the sort process. This process involves connecting a device called a probe card to a special tester. The probe card has a collection of electrical contacts or pins that stands in for the normal pins and wire leads of a packaged device. The wafer is then positioned so that the contacts or pins on the probe card make contact with a given device's bonding pads and the tester runs a battery of electrical tests on the device. A special machine, called a wafer prober, is used to position each device on the wafer with respect to the probe card. High accuracy is required, because the bonding pads are small and if a probe card pin makes contact outside the bonding pad area, the result may be a break in the passivation layer, which generally results in a damaged device.

The primary purpose of wafer probing is to accurately position the collection of devices, or dice, on a wafer in such a manner so that the device's bonding pads make good electrical contact with a probe card's probe tips so that the device may be properly tested before dicing and packaging. There are several different considerations involved in wafer probing. First, due to the thin layer of nonconductive aluminum oxide that forms over the bonding pad during normal atmospheric exposure, there is a requirement that the probe tips travel vertically beyond initial contact. Furthermore, in the most common form of probe card technology, cantilever probes, a portion of this vertical overtravel is transformed into motion along the plane of the wafer, or the scrub, to further guarantee that the tip is in good contact with aluminum and not the oxide. Second, the devices, with the exception of the bonding pads, are coated with an insulating layer. If this substance, which is Essentially glass, is violated by the probe tips, the resultant cracks may damage an otherwise functional device. Given that the typical travel of the probe tip may be 1.5 to 2 mils and that the pad dimensions, or the area where contact is allowed, range in size from 2 to 4 mils, the requirements of accuracy are patently important.

The wafer prober, or prober, is required to do several things in order to probe a wafer. First, the prober, when given a wafer, must be able to accurately align the axis of the indexed dice on the wafer to a specified angle relative to the motion axis of the prober motor. This is generally accomplished via auto alignment. As an additional aspect of auto alignment, the prober needs to be able to find some known position on a wafer relative to some position on the motor repeatably from wafer to wafer in order to avoid making every wafer a training wafer. Second, the prober must know some location of the motor which is known to satisfy the requirements of good probe to pad contact, and must be able to index accurately from that location to the other dice in such a fashion so that the good probe to pad contact is repeated on subsequent dice. The process of finding the location of the motor which yields good probe to pad contact is referred to as probe to pad alignment. An often us;ed synonym for probe to pad contact is setting the first die. In addition to this, the prober must also be taught the vertical contact height of the probes and be able to accurately compensate for varying wafer thickness which is accomplished via wafer thickness profiling. Finally, since not all probe cards can be rotated accurately, an allowance must be made for the prober to be told the probe card's angle, to align wafers to the angle and to additionally index along axes rotated at that angle.

A wafer prober might actually be considered a three dimensional positioner. In addition however, there are a wide variety of features that are involved in the probing process. For example, in order to indicate which dice fail test, the user may wish to ink the dice. These various features together with the means for the users to control them and to monitor the testing process further define the prober and separate it from a simple positioning stage.

Accuracy and throughput issues have led to the development of the notion of the automatic wafer prober. Automation requires that the prober understand the lattice of devices and understand its relationship to the wafer and to the probe card. Furthermore, the system is trained, or the probe card location is shown, only on one wafer per device type. Thus, the system is required to repeat accurate positioning on subsequent like wafers.

Of the three main processes required for good probing—wafer alignment, thickness profiling, and probe to pad alignment—only probe to pad alignment has not traditionally been automated. Previously, while cumbersome, there was not as strong a requirement for automation of probe to pad alignment as the automation of the other two processes. However, developments in semiconductor technology have driven a requirement for automation for several reasons. First, probe cards can now have well in excess of 500 pins. Second, probe array sizes have become larger so that multiple die arrays can now be several inches in one dimension. Third, the tip diameter to pad dimension ratio has become close to one and the pitch, or distance between pins, is approaching the pad dimension. Consequently, the ability of the operator to accurately and rapidly align probe to pads using a microscope becomes more difficult. Hence, there is a growing desire to automate probe to pad alignment.

All semiconductor manufacturer's have the requirement to align probe to pads and wafer sort. Their challenge is to perform this relatively mundane task in the shortest possible time with the greatest consistency of accuracy and alignment.

In addition to the general automation requirement certain probing technologies are evolving which make top side microscope access to the probe array impossible. Prior art membrane probe is a technology which places a plastic membrane directly in the microscopes line of site and makes traditional alignment impractical. Furthermore, prior art high density probe arrays also preclude top side microscope probe to pad alignment. To cope with these new probing technologies and also to continue the pursuit of full automation in the wafer sort area, semiconductor manufacturers require an automatic hands-off light-off probe to pad alignment capability.

Moreover, there are several additional factors that add to the difficulty of probe to pad alignment using a blank aluminized wafer. First, the probe tips at initial contact do not correspond to the pad centers. Second, probe arrays are often not composed of continuous lines; often there are offset pads missing sides or corners, double rows and many other exceptions. Third, dirt in the form of aluminum particles is often left behind on the wafers as a result of the manufacturing process. Fourth, the blank wafer is highly reflective which exacerbates bad lighting and dirty prober microscope optics.

Major vendors of wafer probers have offered some form of automatic probe to pad alignment. However, the forms of automatic probe to pad alignment offered are often not sufficient to provide alignment for modern integrated circuits which have very small, pads and probe tips which are also small and often have imperfect shapes. Consequently, there is a requirement to automatically determine the position coordinates of a probe array and the position coordinates of a first die with sufficient accuracy.

SUMMARY OF THE INVENTION

An improved method and apparatus for automatically aligning a plurality of contact electrodes (e.g. pins on a probe card in a wafer prober) to a plurality of pads of an integrated circuit device are provided. According to one embodiment of an aspect of the invention, a pattern of contact electrodes is located using a low magnification image of a number of contact electrodes. A shape representative of a contact electrode surface is then fitted to each of the number of contact electrodes using a high magnification image of the contact electrodes, and a centroid is determined for each fitted shape which is representative of a contact electrode. The position of the centroid is compared to the position of the corresponding pad, and the pads and contact electrodes are moved relative to each other to a position for contact between the pads and contact electrodes.

According to another embodiment of another aspect of the invention, a number of contact electrodes and a number of pads are accurately positioned relative to each other. In order to accomplish this, a shape representative of a contact electrode point is fitted to each of a number of contact electrodes. A centroid of the fitted shape is then determined. Each of the number of centroids is associated with a corresponding one of a number of pads. A number of distances are next determined relative to a position associated with each of the number of centroids and the number of boundaries of each of the number of pads. The minimum distance of the number of distances is then maximized, and the pads and contact electrodes are moved relative to each other to a position for contact between the pads and contact electrodes.

These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which:

FIG. 18 illustrates a data table for optimization using the Simplex algorithm.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Automatic alignment of contact electrodes of a wafer probe card to the bonding pads of an integrated circuit (IC) device or wafer is referred to herein as automatic probe to pad alignment (APTPA). The APTPA is a method by which a probe card tool point position and angle can be determined without the aid of a human operator-manipulated microscope. The fundamental idea in APTPA is to develop the relationship of the probe card tool points to the wafer pads by: training the wafer pads and knowing their location with respect to a camera in a fashion that is linked to an alignment target position and positioning base; training the probe card's position with respect to the camera; finding the location of the probe card tool points by moving the camera to the probe card area; and through parallel transport of the pad locations, matching the tool point locations to the wafer that will allow probing to that will allow probing to be correct such that adequate electrical contact between the contact electrodes and the pads on the IC may be established.

Figure 1:
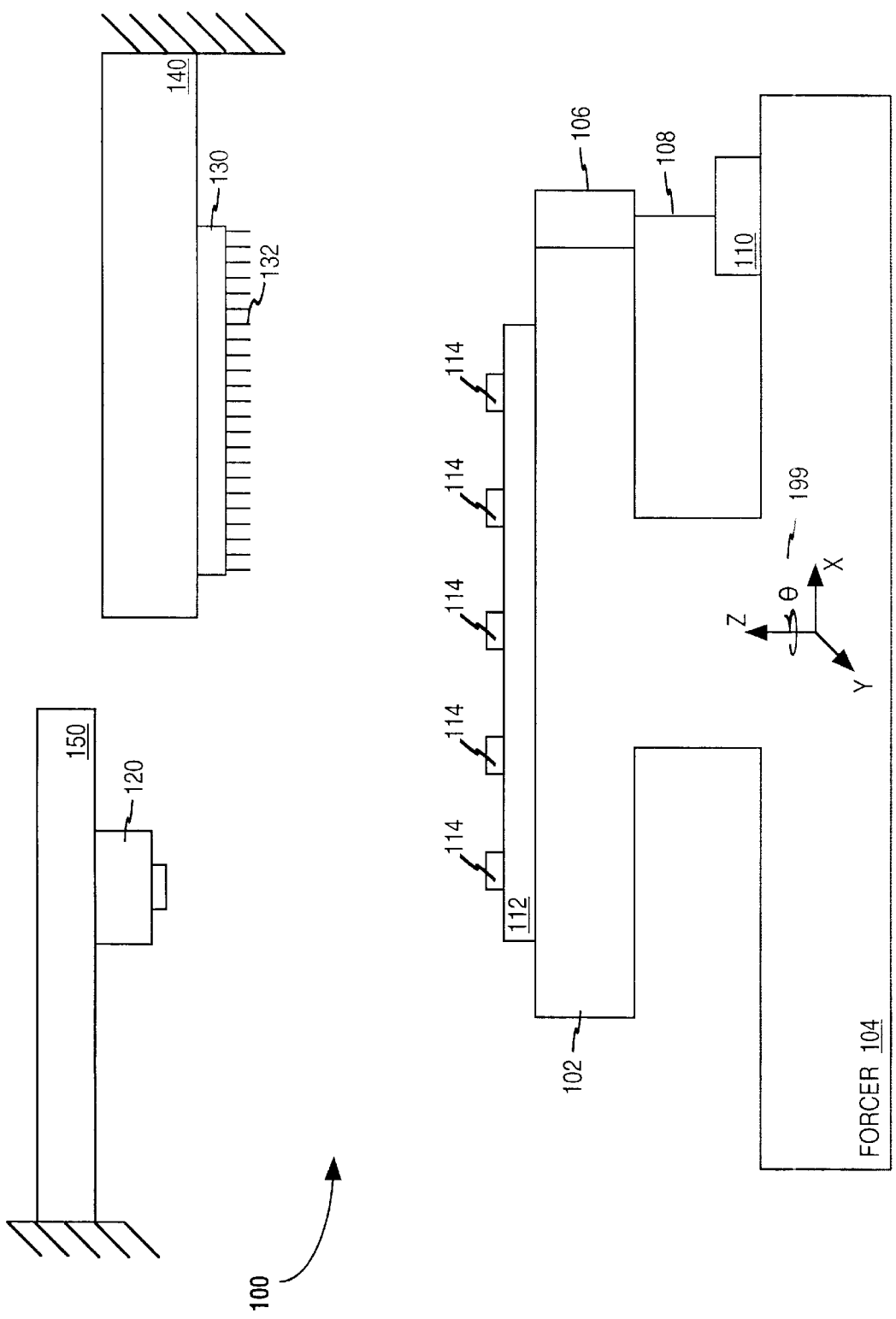
FIG. 1 illustrates an embodiment of a Direct Probe Sensor (DPS) prober implemented by the present invention.

FIG. 1 illustrates an embodiment of a Direct Probe Sensor (DPS) prober implemented by the present invention. The DPS prober performs the automatic probe to pad alignment. The prober 100 is comprised of a wafer chuck 102 moveably coupled to a forcer 104 in a manner which allows the wafer chuck 102 to be moved in the X, Y, Z, and theta directions 199. The wafer chuck 102 accepts the attachment of a wafer 112. The prober 100 also includes a prober chuck 140 which accepts a probe card 130. The probe card 130 may be any of the different varieties of probe cards, including for example membrane probe cards. The probe chuck 140 may be configured to provide movement of the probe card 130 in any of the X, Y, Z, or theta directions 199. The probe card 130 accepted on the probe chuck 140 includes a number of conducting contact electrodes 132. The contact electrodes may in one embodiment include metallic pins 132. These pins 132 make contact with the pads 114 of the wafer 112 when the probe card and the wafer are properly aligned by the prober 100). The pads may comprise any contact electrode surface including, but not limited to a flat surface or a solder bump or pins or posts. The alignment is accomplished using a vision subsystem. The vision subsystem of the prober 100 of the present embodiment uses two cameras, a wafer alignment camera 120 and a sensor camera comprised of components 106–110. The wafer alignment camera 120, which may contain both coaxial and oblique illumination sources, is configured to view a wafer 112 on the wafer chuck 102. The sensor camera 106–110 is configured to view a probe card 130 attached to the probe chuck 140. While the system shown in FIG. 1 probes the wafer horizontally, it will be appreciated that the various aspects of the present invention may be used with vertical prober system in which the flat surface of the wafer is rotated 90° from the position shown in FIG. 1.

Figure 2:
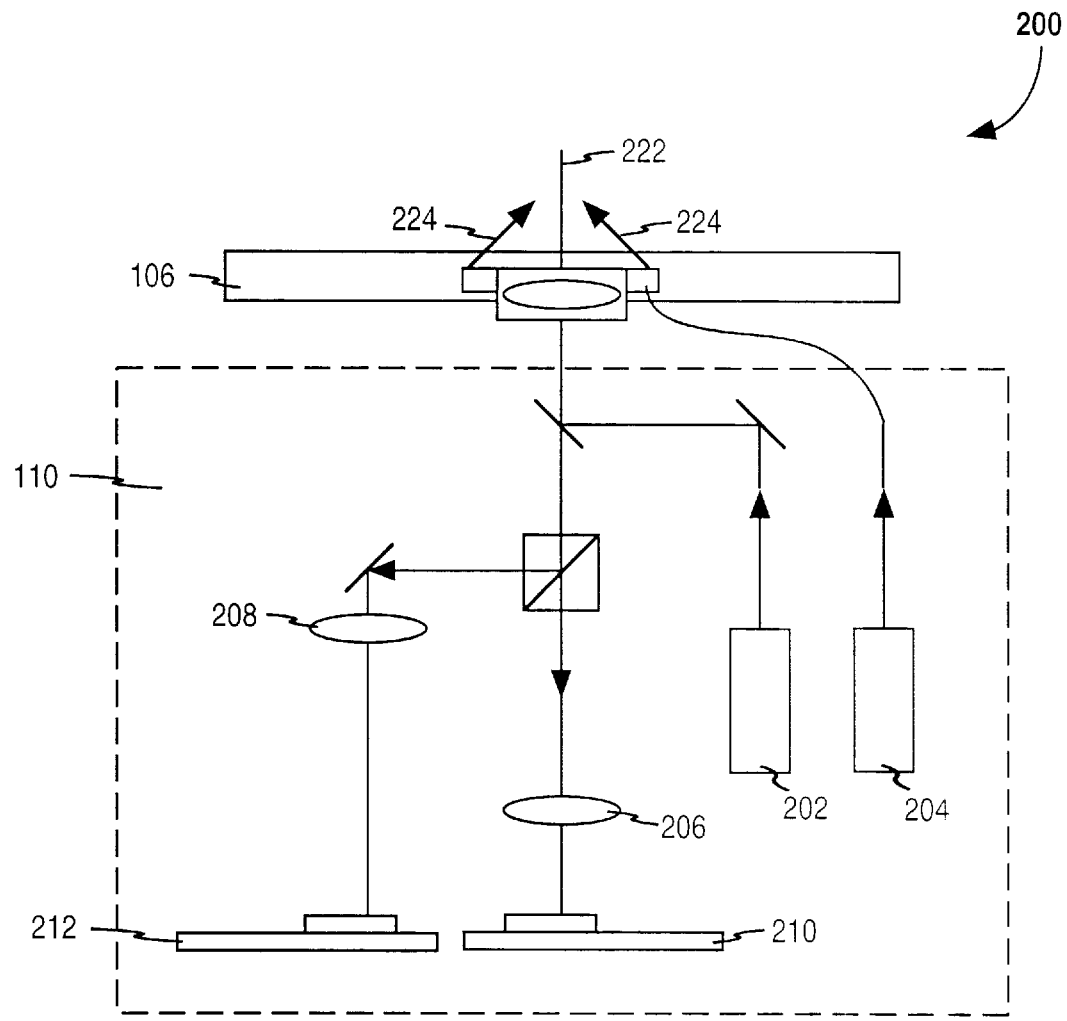
FIG. 2 illustrates an embodiment of the sensor camera implemented by the present invention.

FIG. 2 illustrates an embodiment of the sensor camera 200 implemented by the present invention. The sensor camera 200 functions to image the pins of the probe card and use the information to perform automatic probe to pad alignment. The sensor camera 200 is comprised of two cameras, one for each of two magnification levels. There is, however, only one camera objective with the light path split into two paths. With reference to FIG. 1 the sensor camera 200 is comprised of a front objective lens 106, a camera housing 110 and a connection 108. The front objective lens 106 is coupled to the wafer chuck 102 causing the objective to move with the wafer chuck. The camera housing 110 is coupled to the forcer 104. A connection 108 runs between the front objective lens 106 and the camera housing 110. The sensor camera housing 110 contains two CCD PC Board Cameras, a high magnification camera 212 and a low magnification camera 210. The camera housing 110 also contains high magnification optics 208 and low magnification optics 206 for use with the high magnification camera and the low magnification camera, respectively. Furthermore, the sensor camera housing 110 contains a coaxial illumination source 202 for providing coaxial illumination 222 and an oblique illumination source 204 for providing oblique illumination 224. The camera housing 110 is separated from the lens 106 in order to protect the components in housing 110 from the often extreme temperatures of the chuck 102. For example, the wafer chuck 102 is often heated to high temperatures during testing of the die (after the contact electrodes have made electrical contact with the die's pads). By having the heat sensitive components housed on the forcer separately from the components on the wafer chuck, these heat sensitive components are protected from the temperature extremes of the wafer chuck.

An embodiment of the DPS prober described herein for performing APTPA is for a completely lights-off feature meaning that it is capable of accurate consistent probe to pad alignment without human intervention. In this application of APTPA, wafer identification is read by optical character readers, alignment targets and prober option files are accessed via electronic network or hard disk, each wafer is aligned automatically, and probes are aligned automatically at the first die pads. In the initial phases of bringing a wafer into alignment, probe to pad alignment learns the location of test pads, or virtual pads, and aligns to those pads free of human intervention. This system, in one embodiment, is able to accommodate 0.002 inch pads and multiple die probing requirements. This system is also able to accommodate: epoxy ring ceramic, metal blade, and membrane probe cards; vertical probe cards; single and multiple layer cantilever probes; and multiple die probing from a single card.

Full automation of probe to pad alignment includes learning of probe location information. The wafer pad location information may be automatically trained or an operator may train wafer pad information once at initial product set-up for a particular IC device or wafer. This information will be stored and uploaded and downloaded along with prober set-up parameters and product set-up specifications and alignment targets. Alignment targets may be manually trained or auto-trained with each lot or downloaded via disk, external input/output or some other networking scheme.

Automatic probe to pad alignment using the DPS prober eliminates the difficulties associated with pad alignment. The DPS prober operates by finding the X,Y and Z positions of the probe tips. The DPS prober then checks the tip locations for planarity and calculates the probe centroid location. The DPS prober next calculates a pad touch down location and performs a touchdown. The DPS prober can operate with multiple or single die. As a result the DPS prober increases productivity, accuracy and safety. Productivity is increased because of increased automation and reduced need for operator intervention. Improved ease of use resulting in reduced training requirements and faster probe to pad alignment also increases productivity. Higher accuracy is obtained through decreased variability of set-up between lots resulting in higher consistency and higher yields. A reduced dependence on the operator and avoidance of human error leads to an increase in safety. Because the DPS prober does not use blank wafers, there are no consumables and a corresponding increase in speed results because no blank wafer transport is required.

In order to successfully probe wafers, the location and orientation of the probe card must be known in such a fashion so that aligned wafers can be placed underneath the probe card with good contact between the wafer dice bond pads and the probe card pins. The APTPA using the DPS prober determines the probe card location and angle automatically without operator intervention. Fundamentally, the DPS prober develops the relationship between the probe tips and the pads by: training the pads and knowing their locations with respect to the wafer alignment camera in a fashion that links the location of the pads with the wafer alignment target and system positioning base; training the location of the probe card with respect to the wafer alignment camera; and finding the location of the pins by moving the probe card to the probe area on the wafer, performing a pattern matching algorithm to correctly match the pins with the corresponding pads, and optimizing the position and angle to allow for the best probe to pad contact.

For positioning, the DPS prober uses a coordinate system paradigm, with transformations, as an abstract positioning system. The basic concept is of an abstract platen, or reference coordinate system (RCS), with tools, or points of interest, hovering above it at fixed x-y-z locations. The probe card also has a theta component. The forcer, having the origin defined at the wafer chuck center, then moves around in this abstract system. The wafer concept consists of an idealized wafer, or wafer coordinate system (WCS), divided into dice. The dice use the die coordinate system (DCS), a localized version of the WCS. The WCS has as its origin the center of the die upon which a probe to pad was done. The center of the die is taught via the trained die boundary.

There are various transformations to turn wafer point-to-tool requests (e.g. movement of the wafer relative to a probe card having contact electrodes) into actual requests to the DPS prober motion mechanical system. Generally, the sequence used is: WCS to forcer coordinate system (FCS) including the determination of wafer temperature, wafer angle, and wafer position; FCS to RCS particular tool location; RCS to platen (PCS) temperature; PCS to DPS prober firmware request. The Z position component, or tool height, is considered in parallel in order to move Z to the tool work height less compensating for the wafer thickness. An Electroglas Device Unit (EDU) is a unit of measurement used by the DPS prober software to guarantee that all positions can be calculated accurately and that the entire platen can be expressed by a 32 bit integer.

Figure 3:
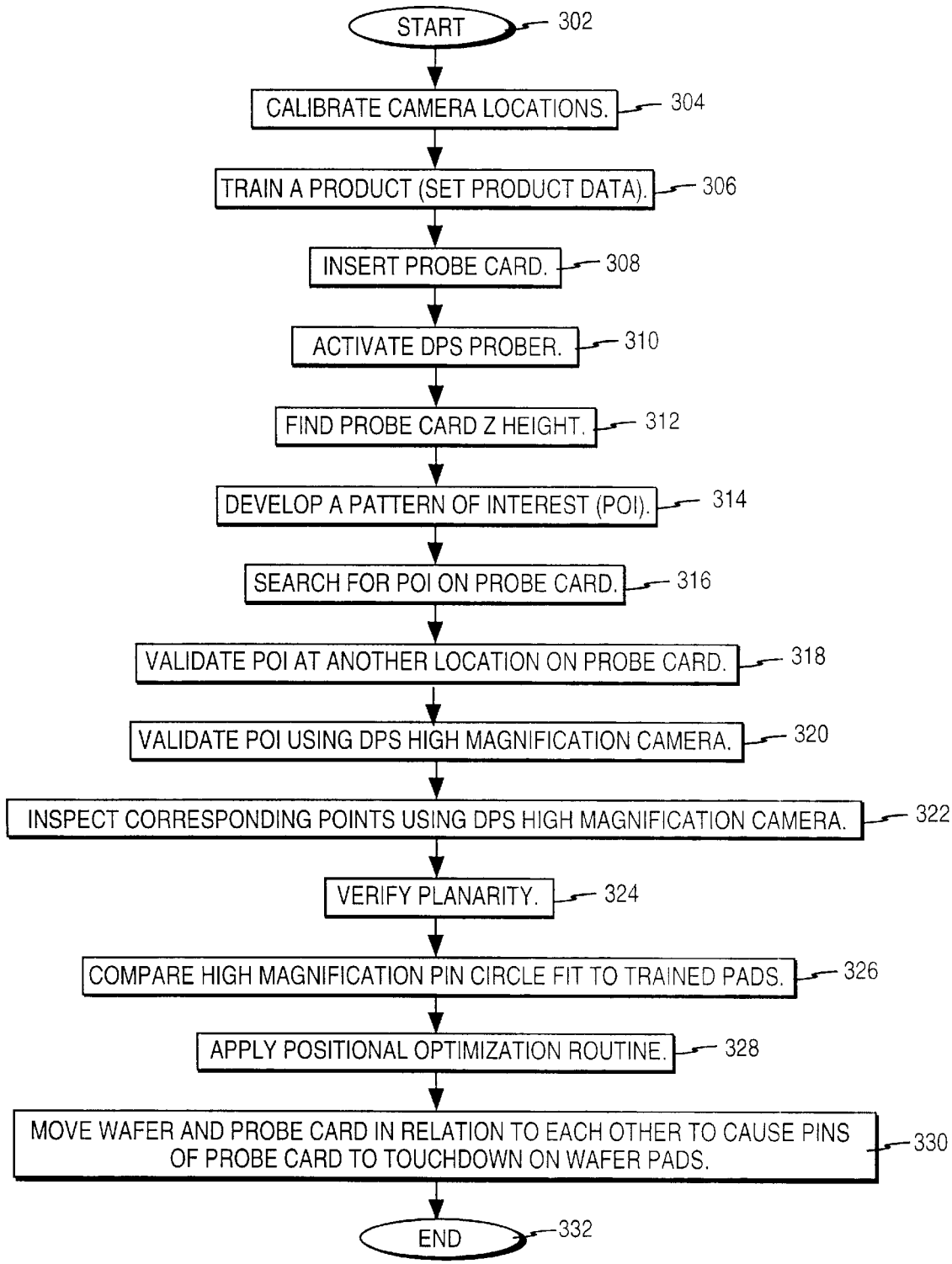
FIG. 3 illustrates a flow diagram for operation of the DPS prober.

FIG. 3 illustrates a flow diagram for one embodiment of the operation of the DPS prober. The flow diagram starts at block 302. Operation continues at block 304, at which the camera locations are calibrated for both the wafer alignment camera and the DPS prober camera. Operation continues at block 306, at which the DPS prober is trained using product data provided by the manufacturer. Operation continues at block 308, at which a probe card is inserted. The DPS prober is activated at block 310. Operation continues at block 312 at which probe card Z height is found. At block 314, a pattern of interest is developed from the trained pads.

Operation continues at block 316, at which a search for a pattern of interest on the probe card is performed using the DPS low magnification camera. Operation continues at block 318, at which the pattern of interest is validated at another location on the probe card using the DPS low magnification camera. Operation continues at block 320, at which the pattern of interest is validated using the DPS high magnification camera. The corresponding points are inspected using the DPS high magnification camera, at block 322. Pin planarity is verified, at block 324. Operation continues at block 326, at which the high magnification pin circle fit is compared to the corresponding trained pads. A positional optimization routine is applied to the data from the high magnification comparison to provide final positioning data and to optimize the position and angle to allow for best probe to pad contact, at block 328. Operation continues at block 330, at which the wafer and probe card are moved in relation to each other in order to cause the pins of the probe card to touchdown on the pads on a die of the wafer. The flow diagram ends at block 332. The details contained in blocks 304–330 will now be explained with reference to FIGS. 4 through 19.

Figure 20:
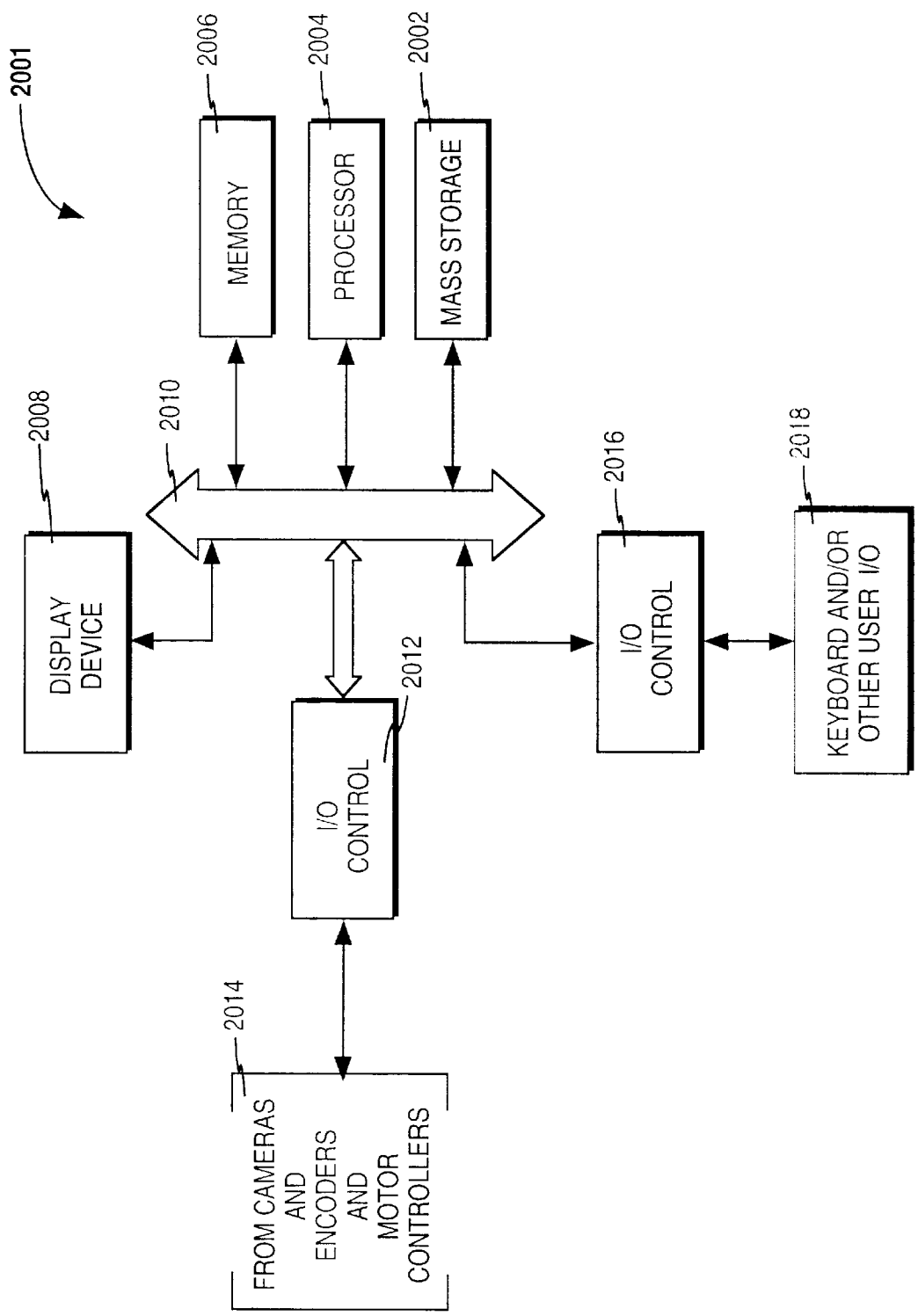
FIG. 20 shows a digital processing system, such as a computer system, which may be coupled to a DSP prober system, such as the system 100, to control the system and process the algorithms and methods described herein.

It will be appreciated that the various steps in FIG. 3 may be performed in other sequences (or omitted entirely) and yet still use the various aspects of the invention. It will also be appreciated that various steps of the invention may be performed in software which is executed on a digital processing system. Typically, this software is stored in a computer readable medium such as a hard disk or optical disk drive or other mass storage device. FIG. 20 shows an example such a digital processing system 2001 which includes a mass storage device 2002 (which may store such software), processor 2004 (which may be a conventional, general purpose microprocessor), memory 2006, display device 2008 and I/O (input/output) controllers 2012 and 2016. These components of system 2001 are typically coupled together through at least one bus 2010. The I/O controller 2012 receives inputs from the cameras and position/motion encoders and motor controllers and provides these inputs to the system 2001 for use by the system 2001. The I/O controller 2012 also provides, at least in certain embodiments, outputs to the illumination sources, to the motor controllers, and to the cameras. These inputs and outputs allow the system 2001 to control the entire DPS operation using a computer program stored in the system 2001. A user may also provide instructions through the user I/O 2018 and determine the status of the system 2001 by viewing the display device 2008. It will be understood that the present invention may be fully implemented in hardware, although this is not preferred.

Camera calibration primarily consists of determining the scale and tilt of the DPS prober cameras. The scale is the size of one pixel with respect to wafer chuck motor motion. The tilt is the axes of the camera with respect to motion. This scale and tilt data is then used by DPS prober vision subsystem software routines to convert positions in pixels to FCS. Generally, however, WCS is actually used and assumed equivalent, which is acceptable.

Scale and tilt calibration can be performed using target training and pattern recognition. Basically, the system works by first training a target. For the low and high magnification wafer cameras the target is on a wafer or the wafer chuck. The forcer is then moved, in RCS, to a series of nearby points in the X direction only and then in the Y direction only, so that the target remains in the field of view. The target is then located and the position recorded in pixels. After this is completed, a scale and tilt, or a coordinate system transform, are fit between the X-Y motion locations and the X-Y pixel target positions. This should yield the desired answers which are typically 0.16 mils per pixel in low magnification and 0.04 mils per pixel in high magnification. Tilt should generally be no more than several tenths of a degree in absolute value.

The user may have an opportunity to validate the camera calibration results. This is done by moving to various locations on the wafer or the wafer chuck and then displaying both the predicted location of the target based on the calibration data and the actual found target location.

The sensor camera position is trained using a special target tool, which is known in the art, that has a crosshair on it that can be simultaneously viewed by both the low and high magnification sensor cameras. The vision module is requested to detect a crosshair, by finding the two lines of the crosshair and then finding their intersection. After the forcer is positioned so that the crosshair is visible by both cameras, each camera in turn finds the crosshair and notes its position. The difference in crosshair locations is noted and then applied to the sensor camera positions.

The sensor camera Z calibration determines the focus height of the sensor camera, defined as the point when pins are focused. This is done by Z scanning (up and down) using an automatic focus with the sensor camera to find the height of a special pin, the Z calibration tool, and then focusing on the pin. The height of the special pin is also determined absolutely by using a chuck probe contact sensor (CPCS). The CPCS is a device that can place a potential on the wafer chuck through a backside contact and detects when a sufficient number of pins having sufficient capacitance make contact with the wafer chuck. Following this, the special pin is focused using an auto focus technique. The difference in heights is then recorded as the focus height of the DPS expressed as a distance above the wafer chuck top height.

The Z scanning is performed using both the low and the high magnification capabilities of the sensor camera. A low magnification Z scanning algorithm is integrated with an incremental scan in the sense that each frame is Z searched until a Z height is established. Subsequent low magnification frames use that height. This means, of course, that the Z height might be found in a frame that does not necessarily contain the particular pins being searched for, but this is not really important. The low magnification algorithm is a three pass algorithm which assumes nothing about the height of the probe tips. For the first pass, large increment steps are used until anything is located. When something is located, fall back one increment; if nothing is found, the frame is assumed empty. For the second pass, mid-sized increment steps are used to scan for a peak in the autofocus measure. The three points around the peak are then fitted with a quadratic polynomial and the maximum of the fit is then taken as the answer. For the third pass, the answer from the first pass is scanned at some distance below and above. The data is smoothed with a moving average filter, and the first true peak is found and returned as the answer.

In high magnification, the Z is scanned on the corner pins first. The user has the option of restricting the Z scanning to those pins only; however, if this is chosen, the area of resultant pins is statistically compared against previous results and is then used as a qualification to determine if the pin should be reinspected with a Z scan. The high magnification Z scanning algorithm uses only the one pass from the low magnification scanning routine because the approximate answer is assumed known from prior low magnification or high magnification inspections.

Figure 4:
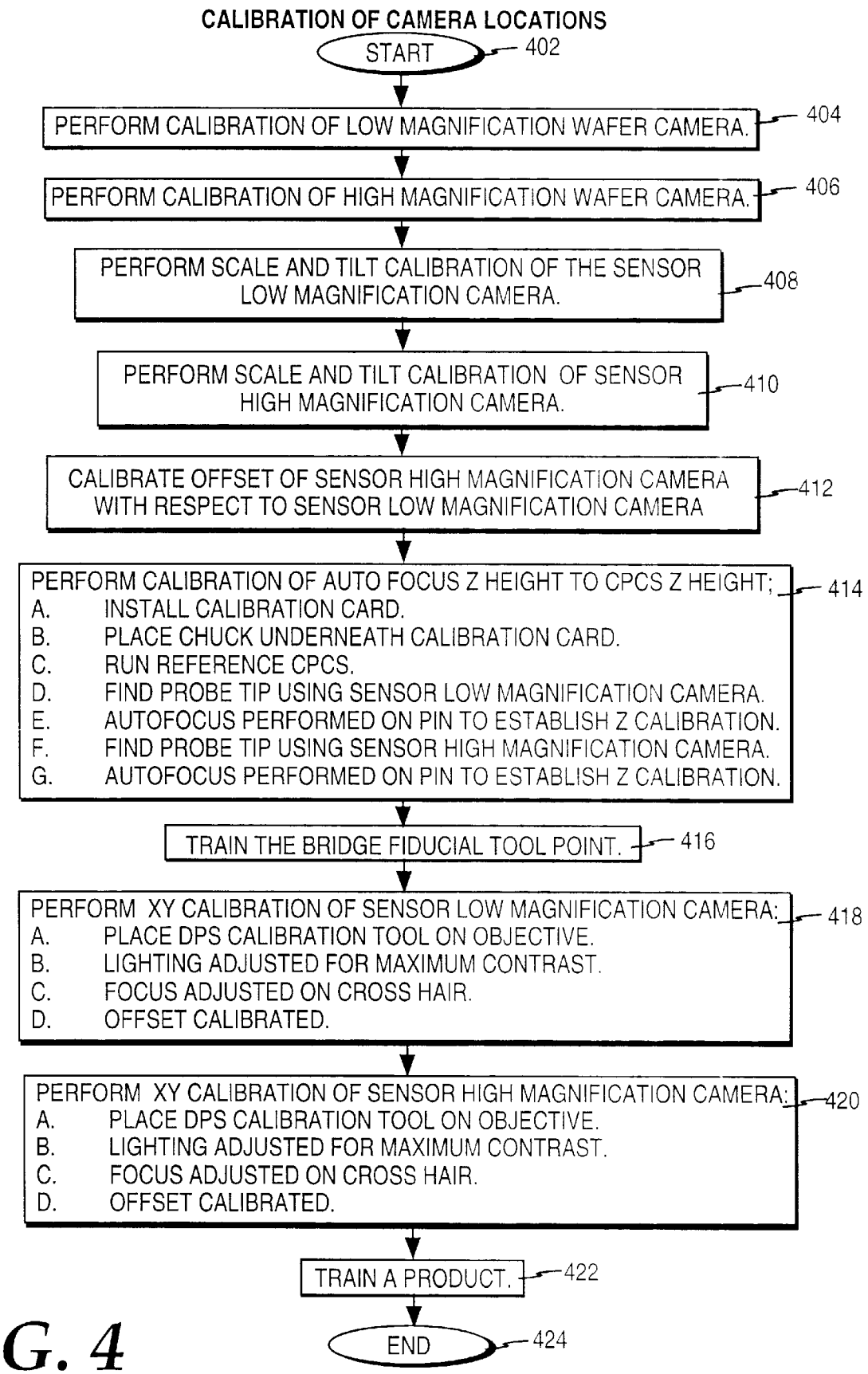
FIG. 4 illustrates a flow diagram for calibration of camera locations of the DPS prober.

FIG. 4 illustrates a flow diagram for calibration of camera locations of the DPS prober. The DPS calibration teaches the system about the characteristic of the DPS with respect to the chuck and the sensor camera. There are several different kinds of calibrations required including scale, tilt, X,Y, and Z calibrations. In addition there are several new tools required to calibrate the DPS prober. Note that the low magnification camera should be fully calibrated before calibrating the sensor camera. The flow diagram starts at block 402. Operation continues at block 404, at which a calibration of the low magnification wafer camera is performed. Operation continues at 406, at which calibration of the high magnification wafer camera is performed. Operation continues at block 408, at which a scale and tilt calibration is performed of the DPS low magnification camera. Scale and tilt calibration is performed using a bridge fiducial mounted on the optics bridge. The bridge fiducial is a small fiducial mounted on the optics bridge near the low magnification sensor camera lens consisting of a crosshair with a number of other features used for autolighting determination and operator identification. Before the sensor camera can be calibrated, the bridge fiducial location must be trained. The position should be close to the default data provided.

Operation continues at block 412, at which the offset of the high magnification sensor camera is calibrated with respect to the sensor low magnification camera. The offset is the amount the prober has to move between high and low magnification to have the same image centered. The purpose of this procedure is to tell the prober where the sensor high magnification camera position is with respect to the sensor low magnification camera position.

Operation continues at block 414, at which the auto focus Z height is calibrated to the chuck probe contact sensor (CPCS) Z height on the sensor low magnification camera. In performing this calibration a calibration card is installed on the probe chuck and the wafer chuck is moved in the position under the calibration card. A reference CPCS is then run. Following the reference CPCS the probe tip is found using the sensor low magnification camera and an auto focus is performed on a pin to established the Z calibration. Next the probe tip is found using the high magnification DPS and auto focus is performed on the pin to establish a Z calibration.

Operation continues at block 416, at which the bridge fiducial tool point is trained. Operation continues at block 418, at which an X,Y calibration is performed using the DPS low magnification camera. The DPS prober X,Y calibration is performed using a special tool called the calibration tool. The tool in one embodiment consist of a small carrier that fits over the objective housing and has a small crosshair fiducial in the top which is at the focus point for the sensor cameras. In another embodiment, the tool may be an automatically inserted reticle, inserted between both the upward looking and downward looking cameras. Lighting is then automatically adjusted to provided maximum contrast and focus is adjusted on the crosshair. The system will then find the crosshair. Operation continues at block 420, at which an X,Y calibration is performed using the DPS high magnification camera. The procedure is the same as that followed in block 418. Operation continues at block 422, at which a product is trained. The flow diagram ends at block 424.

Automatic probe to pad alignment is performed using pads sets which are a subset of all trained pads for position determination. Hence the pads should be trained. Consequently the mask, or alignment target and die boundary, should also be trained. As such, the DPS prober requires information on the specific device to be tested. The device information required from the device manufacturer may include, but is not limited to: product user coordinate system; mask information including die size, center reference, and vectors; wafer physical information including diameter, flat/notch, temperature coefficients; die active area information; an internal representation of the mask data; an internal representation of the die data; die set control map information (zones and lists); bincode information; bingroup information; probing mode information; quality control information; wafer identification information; inker parameters; and alignment models and parameters.

Figure 5:
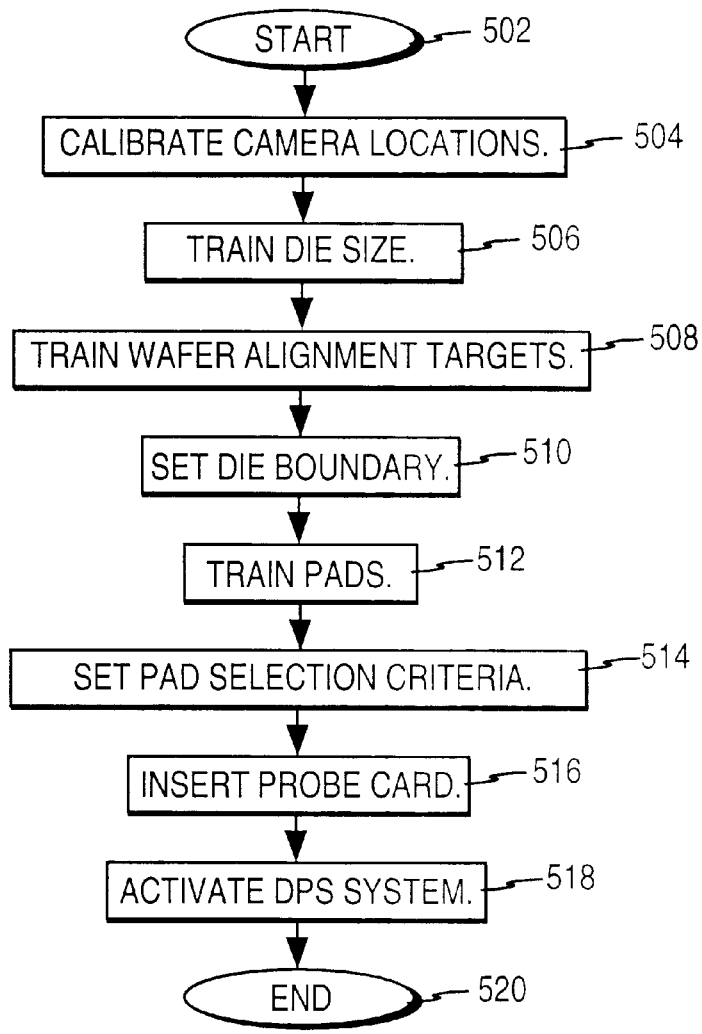
FIG. 5 illustrates a flow diagram for training a product for use with the DPS prober.

FIG. 5 illustrates a flow diagram for training a product for use with the DPS prober. The flow diagram starts at block 502. Operation continues at block 504, at which camera locations are calibrated. Operation continues at block 506, at which die size is trained. The die size is trained by loading information into the prober provided by the wafer manufacturer on the size of the die. Die size may also be trained by the prober from a representative product. Wafer alignment targets are trained, at block 508. Operation continues at block 510, at which die boundaries are set. Die boundaries may be set using information provided by the wafer manufacturer or by using data obtained from a representative product. Operation continues at block 512, at Which pads are trained. Pads may be trained using information provided by the manufacturer or using data obtained from a representative product.

Operation continues at block 514, at which pad selection criteria are set. Pad set 0 is used for probe to pad alignment low magnification search, and a probe to pad alignment pad set is used for the final high magnification probe to pad alignment calculation. There are four pad selection criteria to follow in one embodiment in order to maximize the probe to pad alignment success rate. First, pad set 0 must have enough pads in one corner to have a unique pattern (recommend at least four pads). Second, pad set 0 must have one or two pads in the opposite corner that is far enough away to accurately establish the probe angle. Third, pad set 0 must have one pad in the third corner for high magnification verification. Fourth, pad set 0 must have one pad in a corner for high magnification verification in case there is a problem with the first verification. Operation continues at block 516, at which a probe card is inserted. At block 518 the DPS prober is activated. The flow diagram ends at block 520.

Figure 6:
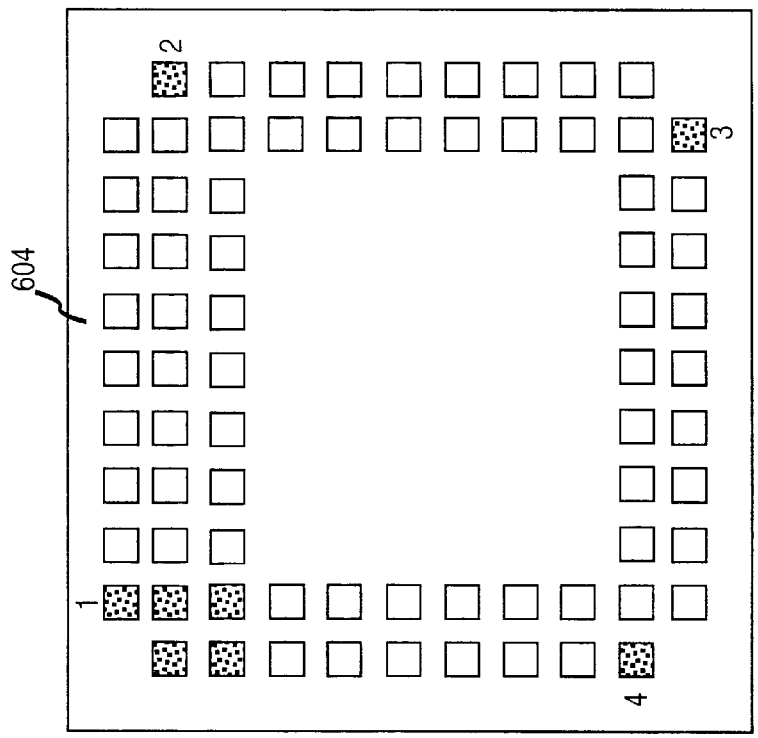
FIG. 6 illustrates two examples of recommended pads to train when using single die.
Figure 6:
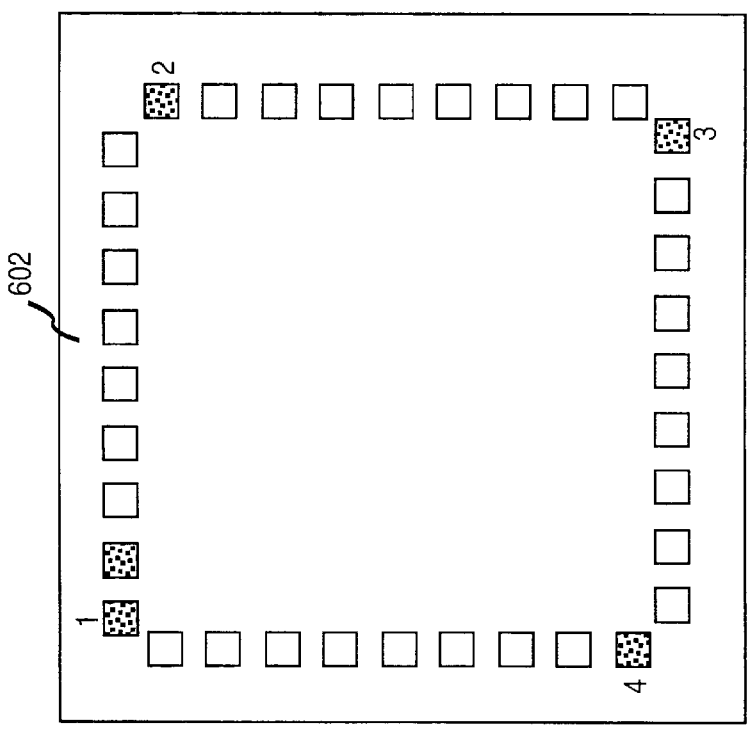
Figure 7:
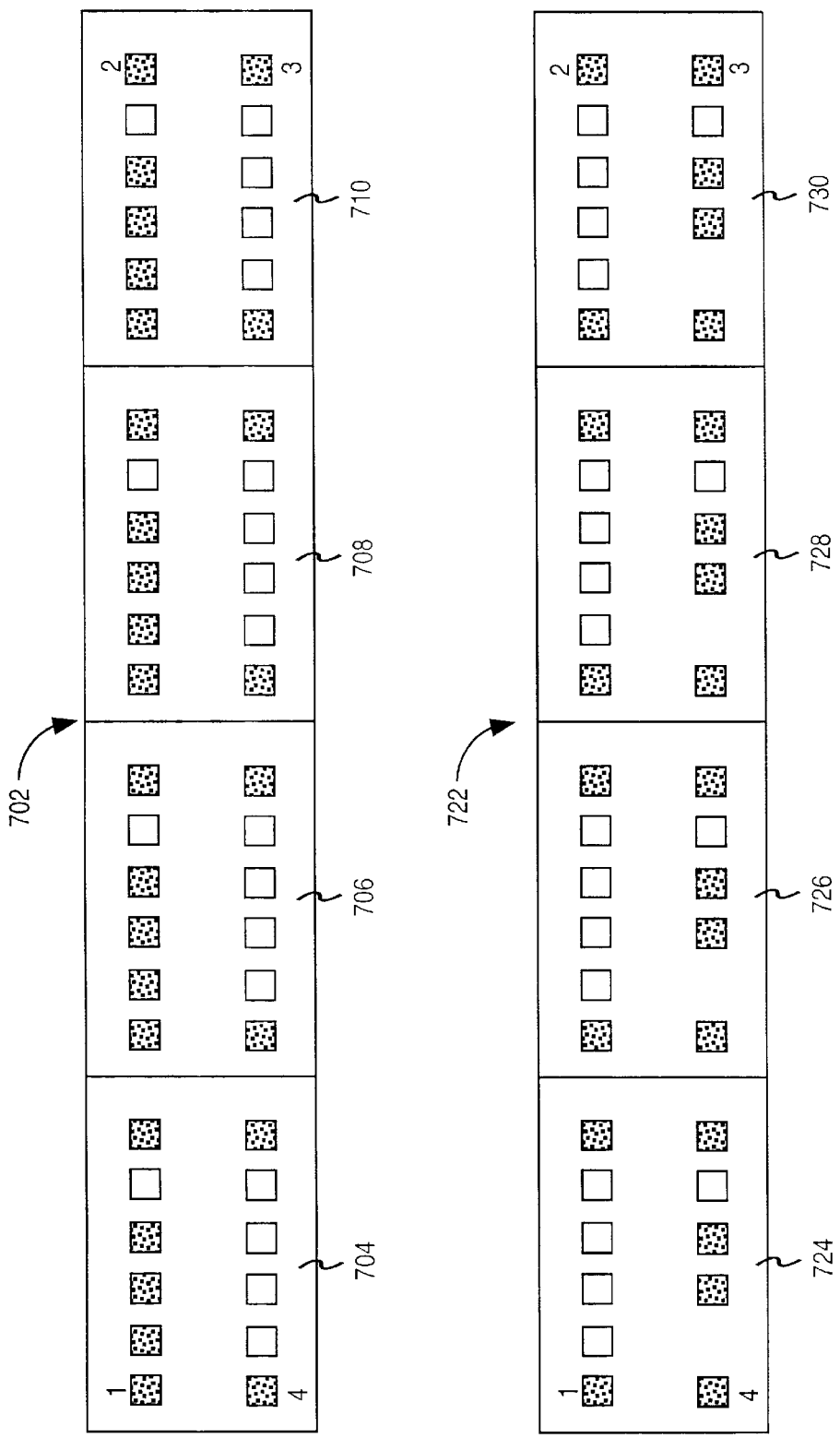
FIG. 7 illustrates two examples of recommended pads to train in multiple die arrays.

Regarding the setting of pad selection criteria performed at block 514 of FIG. 5, FIGS. 6 and 7 illustrate examples of recommended pads to train when using both single die's and multiple die arrays. FIG. 6 illustrates two examples of recommended pads to train when using a single die. Die 602 has a different configuration of pads than die 604. In both die 602 an 604 the grey pads are the recommended pads to train. The pads with numbers are pads for the probe to pad alignment pad set.

FIG. 7 illustrates two examples of recommended pads to train in multiple die arrays. Multiple die array 702 is comprised of die 704, 706, 708 and 710. Multiple die array 722 is comprised of die 724, 72.6, 728 and 730. In both multiple die arrays 702 and 722 the grey pads are recommended pads to train and the pads with numbers are pads for the probe to pad alignment pad set. The difference between multiple die array 702 and multiple die array 722 is the missing pin. The missing pin causes the selected pads to form a more unique pattern.

Figure 8:
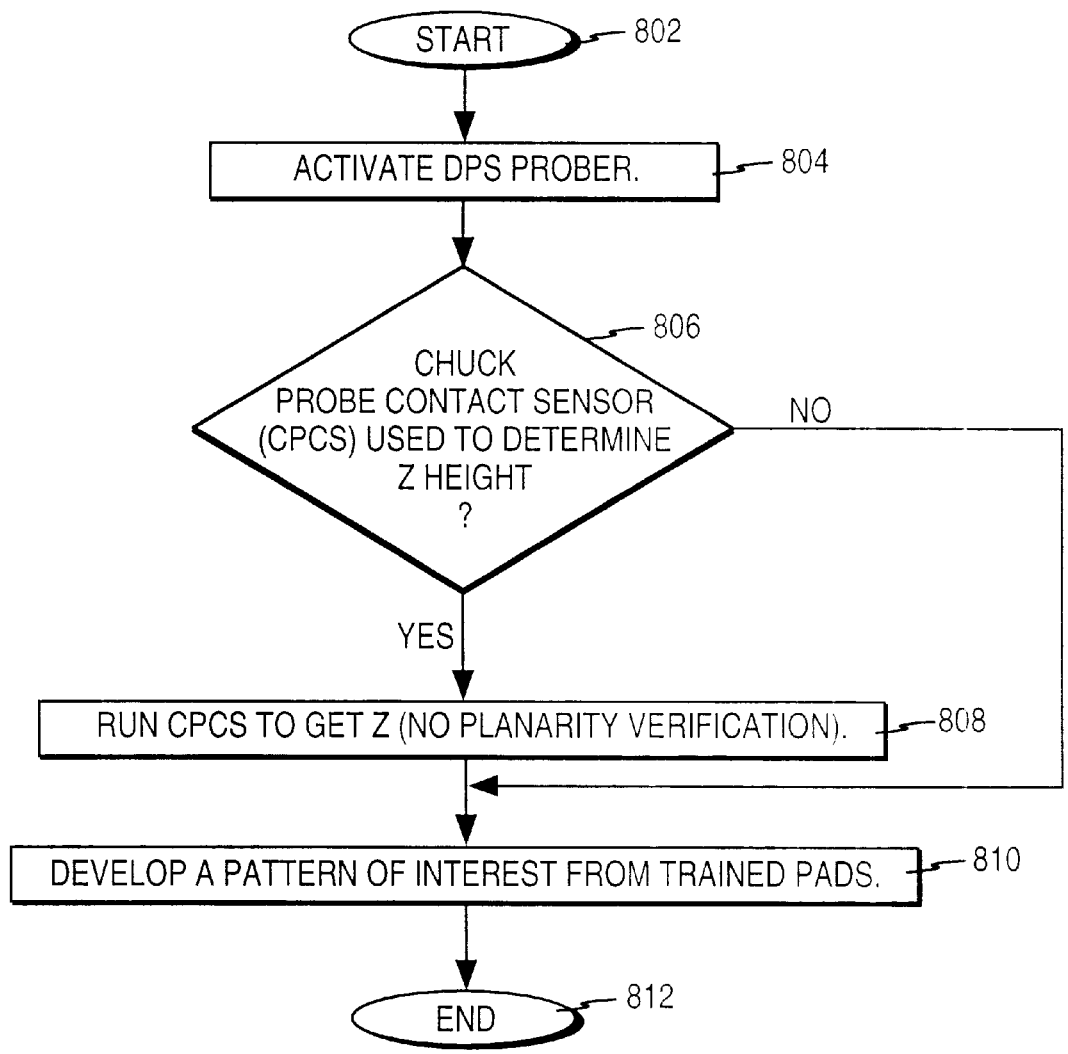
FIG. 8 illustrates a flow diagram for finding a probe card Z height.

FIG. 8 illustrates a flow diagram for finding a probe card Z height. The flow diagram starts at block 802. Operation continues at block 804, at which the DPS system is activated. Operation continues at block 806, at which a chuck probe contact sensor (CPCS) may be used to determine the Z height of probe card pins. If the CPCS is used to determine the Z height at block 806, then operation continues at block 808, where the CPCS is run in order to determine the Z height. Following the running of the CPCS at block 808, or if the CPCS is not used to determine the Z height of the probe card pins, then operation continues at block 810. At block 810 a pattern of interest is developed from the trained pads. The flow diagram ends at block 812.

Figure 9:
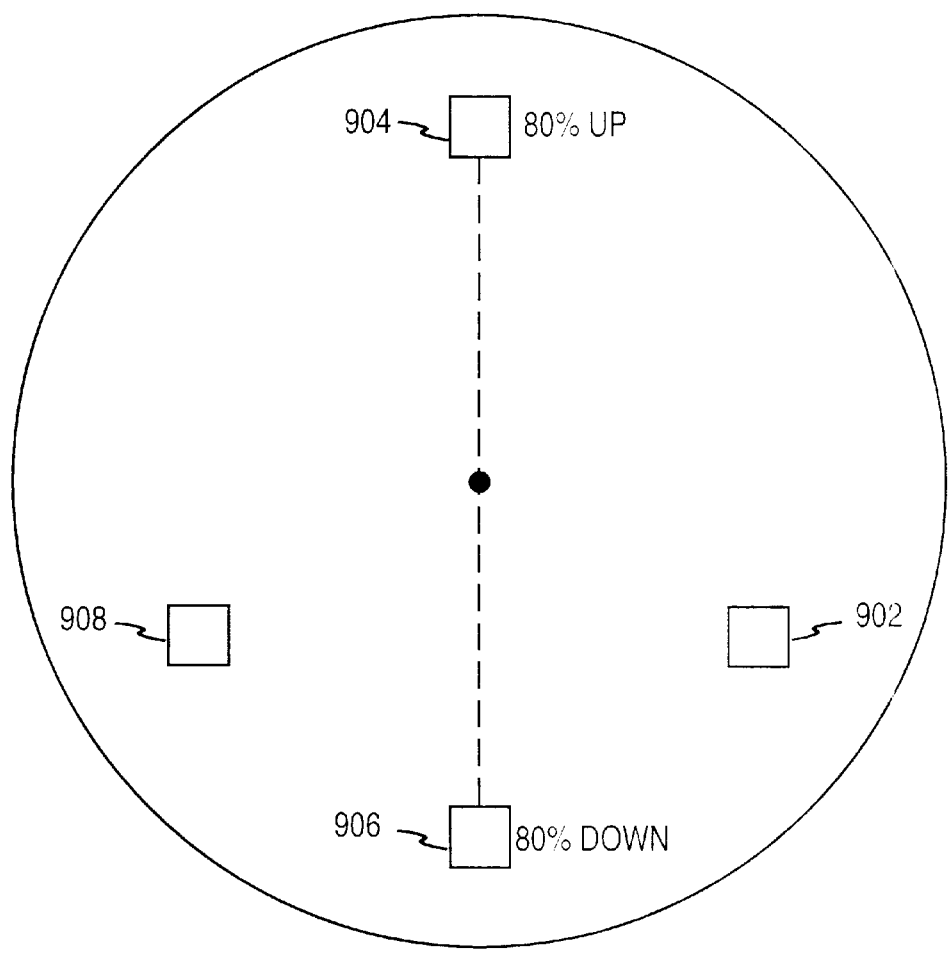
FIG. 9 illustrates a pattern recognition technique used by the DPS prober vision subsystem to find a target pattern with which to align the subsystem.

The principle used in one embodiment of the APTPA is that there exists a reasonably unique pattern on each die, which can be found on each die by the vision subsystem. FIG. 9 illustrates a pattern recognition technique used by the DPS prober vision subsystem to find a target pattern 902 with which to align the subsystem. This target pattern 902 will be used at extreme points 904 and 906 on the wafer to determine error in angle while a special target, the original training target 902, is used to null the position. The extreme points 904 and 906 on the wafer, in one embodiment, are those points located at the 80% radial distance defined relative to the center point and the extreme points of the wafer. The extreme points 904 and 906, in one embodiment, are located on the same radial axis through the center of the wafer. The target pattern 908 is used for coarse align and, in one embodiment, is horizontally aligned with training target 902. Thus, the DPS prober allows for repeatable positioning of a wafer with respect to the probes without resetting probe to pads.

The vision subsystem alignment is accomplished using a normalized correlation method of pattern recognition. The alignment is performed in one embodiment of the DPS prober by using a training target, or wafer, to set the motion system to match the probe card angle. The offset is the trained product default, compensated by the wafer center. The DPS prober moves the expected location of a training target to the wafer camera. A target close to the wafer center will be less sensitive to angular error at this point. The DPS prober then searches for and locates the target using the wafer camera. The DPS prober may spiral search for the target. The DPS prober next corrects the offset by an amount required so that if the same motion command were requested the target would be centered. The DPS prober then steps over by a die and searches for the target using wafer class functions to determine where to move. The DPS prober then rotates the chuck by the detected angular error. The offset is updated so that alignment will not have to spiral search for the target. The DPS prober then moves up to points 80% up and down radially and similarly corrects angular error. When the angular error is less than the ability of the theta motor to correct (for example 16 microradians), the DPS prober updates the appropriate coordinate system conversion record. The DPS prober again moves the training target to the camera center and corrects the offset. This move-correct loop repeats several times until no significant correction can be made.

In addition, alignment can find a second reference which, after alignment, is used to verify that the target was found on the correct die. It is generally a target unique on the wafer. When the second reference offset correction is made, it will be by whole die steps. As an alternative to second reference alignment, the DPS prober can also step over and count dice to the edge.

Training is a process similar to alignment except that there is no offset correction. In training, a target may be trained manually or automatically by the vision subsystem. Training has no offset correction, but an angular correction is applied so that the wafer is aligned at the end of the procedure. There is a nulling procedure in which the target is moved to the center but the offset is not changed; instead the target is retrained at the end of the procedure and the final location is stored as the target position.

The bonding pads are trained with reference to an alignment target. Trained pads may be determined from the device specification data provided by the device manufacturer. Alternatively, pads may be trained by the vision subsystem with very little device specification data. A POI is developed from the trained pads, and when examining the probe card, the vision subsystem searches for the same target POI among the pins of the probe card. The search procedure used is the sa:me as previously discussed with regards to alignment. When the target POI is found among the probe card pins, the vision module returns the location of the found target in pixels which is then converted to a position in EDUs which can be used by the system to make the necessary corrections for touchdown.

Figure 10:
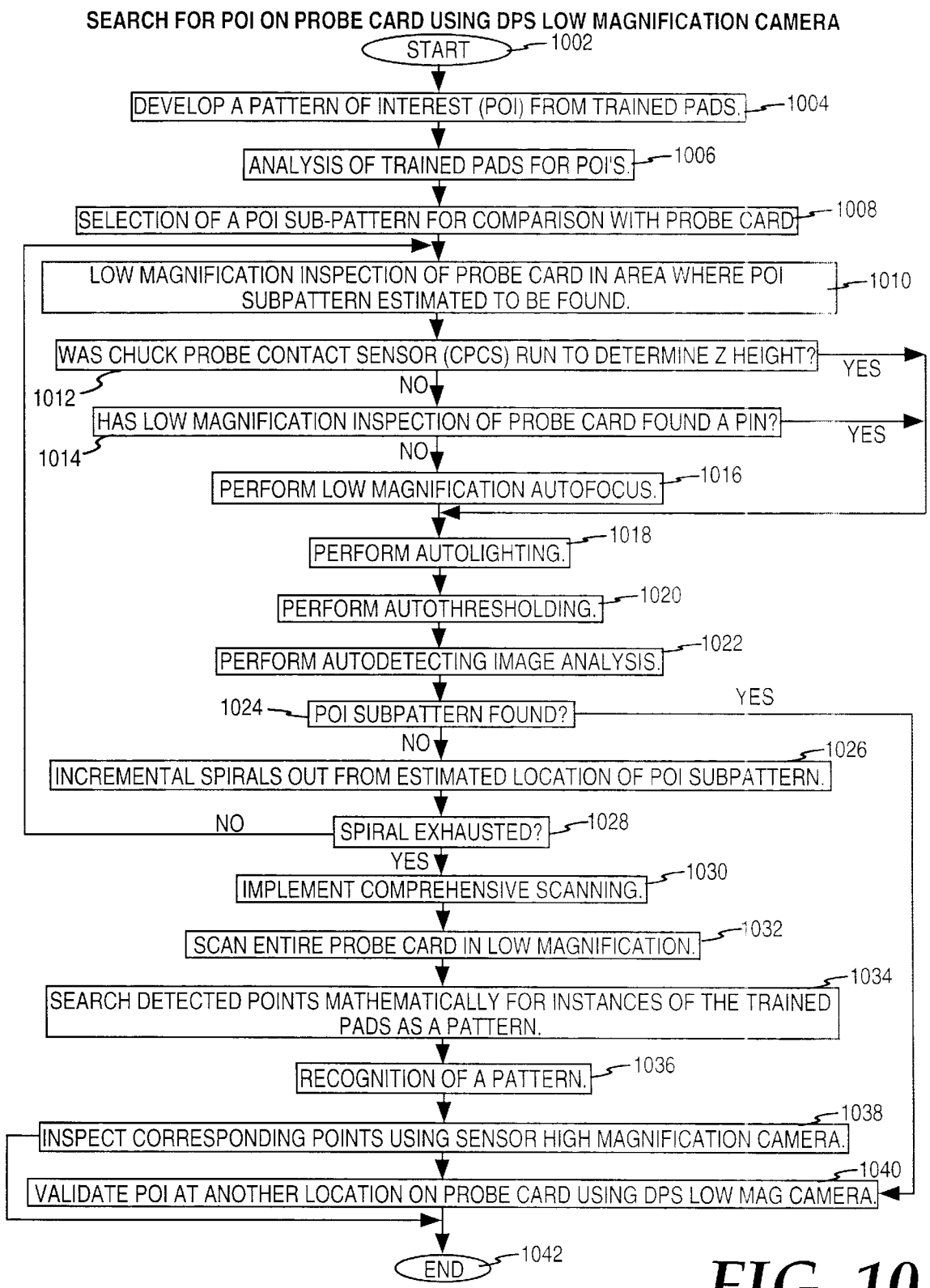
FIG. 10 illustrates a flow diagram for searching for a pattern of interest on a probe card using the DPS low magnification camera.

FIG. 10 illustrates a flow diagram for searching for a pattern of interest on a probe card using the DPS low magnification camera. The flow diagram starts at block 1002. A pattern of interest is developed from trained pads, at block 1004. Operation continues at block 1006, at which the trained pads are analyzed for a pattern of interest that fits within the single field of view of a DPS camera. Operation continues at block 1008, at which a sub-pattern of the pattern of interest is selected for comparison with the probe card pins. Operation continues at block 1010, at which a low magnification inspection of the probe card is accomplished by the DPS camera in an area of the probe card where the sub-pattern of the pattern of interest is estimated to be found.

If the CPCS was run as described with reference to FIG. 8, operation continues at block 1018. If the CPCS was not run, operation continues at block 1014, at which it is determined whether the low magnification inspection of the probe card has located a pin. If a pin has been located, operation continues at block 1018. If no pin has been located, operation continues at block 1016, at which a low magnification autofocus is performed. Following the low magnification autofocus, operation continues at block 1018.

The autofocus performed at block 1016 is performed using an autofocus algorithm that in one embodiment inspects an image where the pins are at or near saturation. The threshold image is segmented into pin and non-pin blobs according to shape, size, and intensity. Autothresholding is performed in one embodiment on an entire image to determine the background grey-level representing space. A threshold is applied and only the areas that are above the threshold are passed through. Each region of pixels passed through is called a blob. The autofocus algorithm of this embodiment uses the gradient information of the body of the blob area as a measure of best focus but several other measures are also available, including using the detected edge information in the blob area as a measure of best focus.

Figure 11:
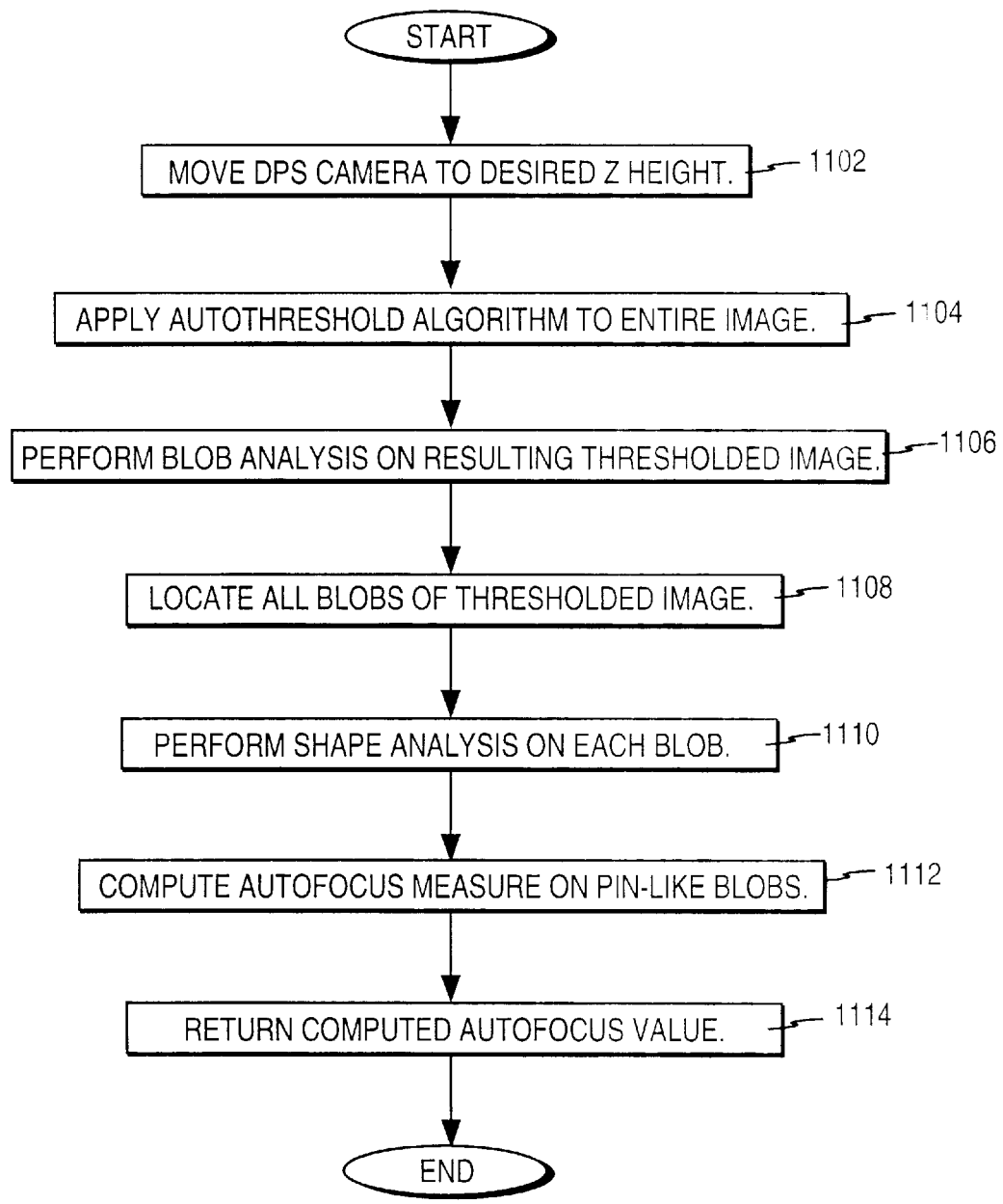
FIG. 11 illustrates a flow diagram of the autofocus algorithm of one embodiment of the present invention.

FIG. 11 illustrates a flow diagram of the autofocus algorithm of one embodiment of the present invention. When performing probe to pad alignment using low magnification, operation begins at block 1102, at which the DPS camera is moved to the desired Z height. At block 1104, the autothreshold algorithm is applied to the entire image. A blob analysis is performed on the resulting thresholded image, at block 1106. All blobs of the thresholded image are located, at block 1108, because each blob represents an area potentially deemed to be a pin.

Operation continues at block 1110, at which a shape analysis is performed on each blob. In one embodiment, if a blob is not pin-like, it is eliminated from the actual autofocus measure calculation. At pin-like blob is defined as having an approximately circular outline shape whose size corresponds within a tolerance band of expected sizes for the particular type of probe pin expected. For all pin-like blobs the autofocus measure is computed, at block 1112. One of the following three measures may be used: the total blob area; an average of the gradient o:E intensities information in the surrounding area of each qualified blob, inclusive; an average of the gradient of intensities information in the inside area of each qualified blob. At block 1114, a computed autofocus value is returned. When using the total blob area to measure autofocus, a smaller autofocus value indicates greater focus. When using an average of the gradient of intensities information in either the surrounding area or the inside area of a qualified blob, a smaller autofocus value indicates less focus.

When performing probe to pad alignment using high magnification, the out-of-focus algorithm is as previously discussed when performing probe to pad alignment using low magnification with two exceptions. First, at block 1108, only one blob is expected. Second, the expected blob is to be located near the center of the high magnification field of view.

Referring again to FIG. 10, following performance of the low magnification autofocus at block 1016, the DPS prober performs autolighting to optimize the visibility of the pins, at block 1018. Visibility within the DPS prober system, in one embodiment, is defined as the best separation between the background pixels, or the area not the pins, and the foreground pixels, the area of the pins. Background pixels can either be due to internal backreflection of the optics or could be other parts of the probe card assembly being illuminated such as the cantilevers and blades. The autolighting algorithm automatically adjusts a light level to distinguish between the pixels of the background and the pixels of the contact electrodes, thereby setting a light level that produces an optimum contrast in the sensor camera low or high magnification image. In the low magnification case, the entire image field of view is evaluated. In the high magnification case, a centered reduced image window is used to evaluate the image grey scale attributes.

In the autolighting algorithm, the standard deviation of the image may be used as a measure of contrast. This algorithm has the property that if there is anything at all, even just background and dirt on the optics, it will be illuminated. The auto light level, in one embodiment, maximizes the difference between the background and the foreground so that it has a grey scale value roughly in the middle of the range of possible values (0 to 63) and any bright object appears to be near or at saturation (maximum possible value 63). The size of the standard deviation can be used as an indicator of whether any real object is in the image.

Figure 12:
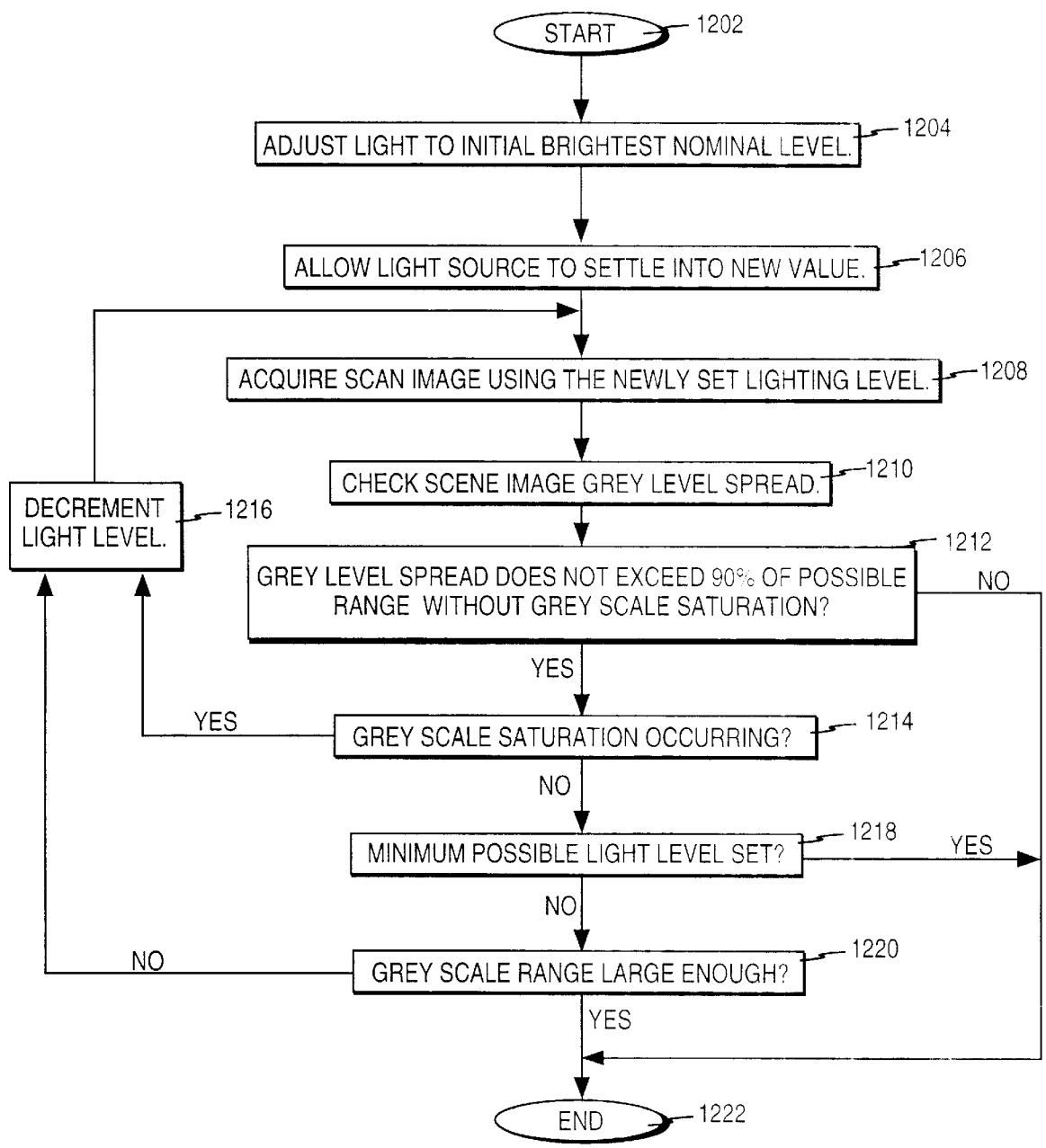
FIG. 12 illustrates a flow diagram of the autolighting algorithm of one embodiment of the present invention.

FIG. 12 illustrates a flow diagram of the autolighting algorithm of one embodiment of the present invention. The flow diagram starts at block 1202. Operation continues at block 1204, at which the light level is initially adjusted to the brightest nominal level. The algorithm starts with the brightest light setting and gradually reduces the lights intensity in order to optimize the timing of the autolighting function. In many cases, the light levels determined by the autolighting algorithm are near the top end of the lighting range.

Operation continues at block 1206, at which a delay is initiated to allow the light source to settle into the new value. The length of this delay depends on the light source used. Incandescent lights can require up to a one second delay to properly settle, where light emitting diodes have a relatively shorter settling time. Operation continues at block 1208, at which a scan image is acquired using the newly set lighting level.

Following acquisition of a scan image, operation continues at block 1210, at which the scene image grey level spread is checked. If it is determined that the grey level spread exceeds 90% of the possible range without grey scale saturation, at block 1212, then the light level is correct and the autolighting algorithm ends at block 1222. If it is determined that the grey level spread does not exceed 90% of the possible range without grey scale saturation, at block 1212, then operation continues at block 1214, at which a determination is made regarding the occurrence of grey scale saturation. If grey scale saturation is occurring, then the light level is decremented at block 1216, and operation continues at block 1208, at which a scan image is acquired using the newly set lighting level. The loop of blocks 1208 through 1216 are repeated until grey level saturation is no longer occurring in the acquired image.

If grey scale saturation is not occurring, then operation continues at block 1218, at which it is determined whether the minimum possible light level is set. If the minimum possible light level is set, then the light level is as good as it can get and the autolighting algorithm ends at block 1222. If the minimum possible light level is not set, then the algorithm determines, at block 1220 whether the grey scale range is large enough. If the grey scale range is not large enough, the light level is decremented, at block 1216, and operation continues at block 1208. If the grey scale range is determined to be large enough, the autolighting algorithm ends at block 1222.

Referring again to FIG. 10, when a light level is found that produces, in one embodiment, the maximum contrast and the imaging, operation continues at block 1020, at which autothresholding is performed to separate the dark background and the bright pins. The autothresholding function computes the average between the mean or median (the background) of the autolighted image and the bright peak (object or near saturation) so as to set a threshold that will adequately ignore background image characteristics. It has empirically been shown that if there are pins present in the DPS prober field of view, and the pins are in focus, they will be the brightest objects present. In the case of low magnification, the pins will represent only a small fraction of the total image area. From this, the background pixel characteristics can be estimated by ignoring the top few percent of the brightest grey scale pixels in the field of view. In the case of high magnification, the assumption cannot be made that the majority of pixels are background. Therefore, when using high magnification, a centered reduced field of view is used containing a single probe so that this probe will occupy the majority of pixels in the field of view.

The autothresholding algorithm functions by finding a threshold value under which all of the background pixels should reside. The algorithm assumes that a majority of pixels in an image are background and by taking the median grey level of the pixels and adding a 0.15% uniformity factor plus one, the background of the images can effectively be thresholded away. Therefore, after thresholding, only the image of the cantilever and the pins remain. For DPS prober low magnification pin detection, the algorithm is applied using the full field of view. For DPS prober high magnification pin detection, the algorithm is applied using a centered window with dimensions of 200 pixels by 200 pixels in the field of view. Following the automatic setting of a threshold, operation continues at block 1022, at which an autodetecting image analysis is performed to determine the centeriods of the probe card pin images.

The autodetect algorithm, following automatic adjustment of light threshold and focus, performs a blob analysis to determine if something is in the image. When the DPS prober algorithms have determined that something is in the image and the image is possibly that of pins, then the image is compared against the subpattern of the pattern of interests and verified against that pattern. If the DPS determines that it has recognized a pattern of the subpattern of interest, at block 1024, operation continues at block 1040, at which validation of the pattern of interest takes place at another location on the probe card using the DPS low magnification camera. The flow diagram ends at block 1042.

If the DPS does not recognize a pattern of the subpattern of interest at block 1024, then operation continues at block 1026, at which incremental scanning is implemented. Incremental scanning in one embodiment does not scan the entire array. Instead the prober using incremental scanning analyzes the trained pads for interesting subpatterns that fit within a single field of view. The DPS prober then selects a subpattern that it wants to work with and, based on the nominal location, inspects in low magnification where it expects to find the sub-pattern. It will then spiral search out from the estimated location of the subpattern of the pattern of interest to the limit of the positional tolerance until it recognizes a subpattern which is not necessarily the original sub-pattern.

Following incremental spirals out from the estimated location of the pattern of interest, operation continues at block 1028, at which a determination is made whether the spiral is exhausted, or whether the spiral has reached the limits of the die. If the DPS prober determines that spiraling is not exhausted, operation continues at block 1010, which was previously described. The steps described in block 1010 through 1024 are repeated until the DPS prober recognizes a subpattern, at which point validation of the pattern of interest takes place at another location on the probe card using the DPS low magnification camera.

If the DPS prober determines that spiraling is exhausted, operation continues at block 1030, at which the DPS prober implements comprehensive scanning. Using comprehensive scanning, operation continues at block 1032, at which the DPS prober scans the entire probe card area using the DPS low magnification camera. Operation continues at block 1034, at which the DPS prober will search all detected points mathematically for instances of the trained pad as a pattern. Operation continues at block 1036, at which the DPS prober recognizes a pattern. Following pattern recognition, the DPS prober inspects corresponding points using the DPS high magnification camera, at block 1038. The flow diagram ends at block 1042.

Figure 13:
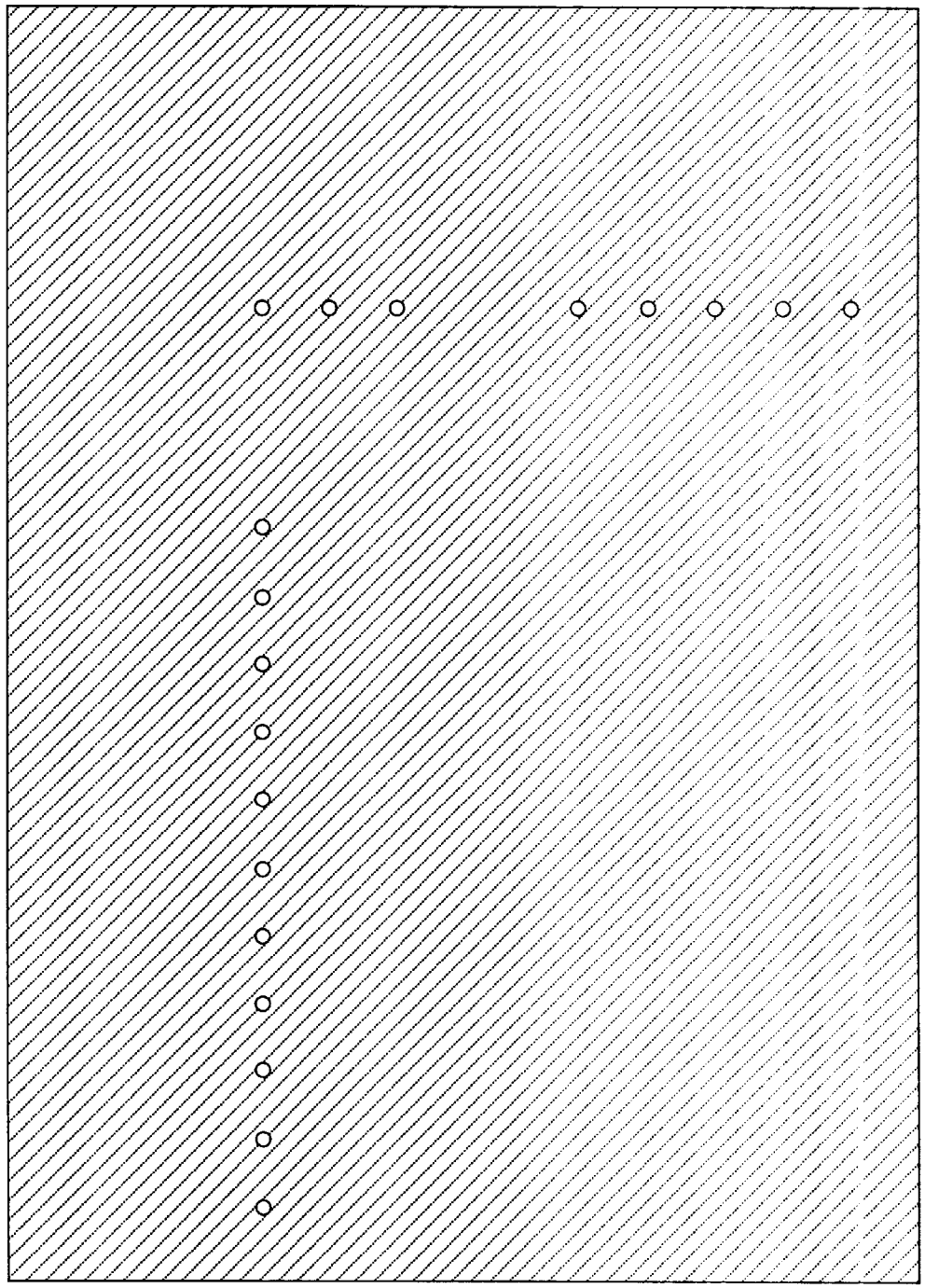
FIG. 13 illustrates a representative image from the DPS low magnification camera.

FIG. 13 illustrates a representative image from the DPS low magnification camera. This representative image depicts an image of a pattern of pins.

Figure 14:
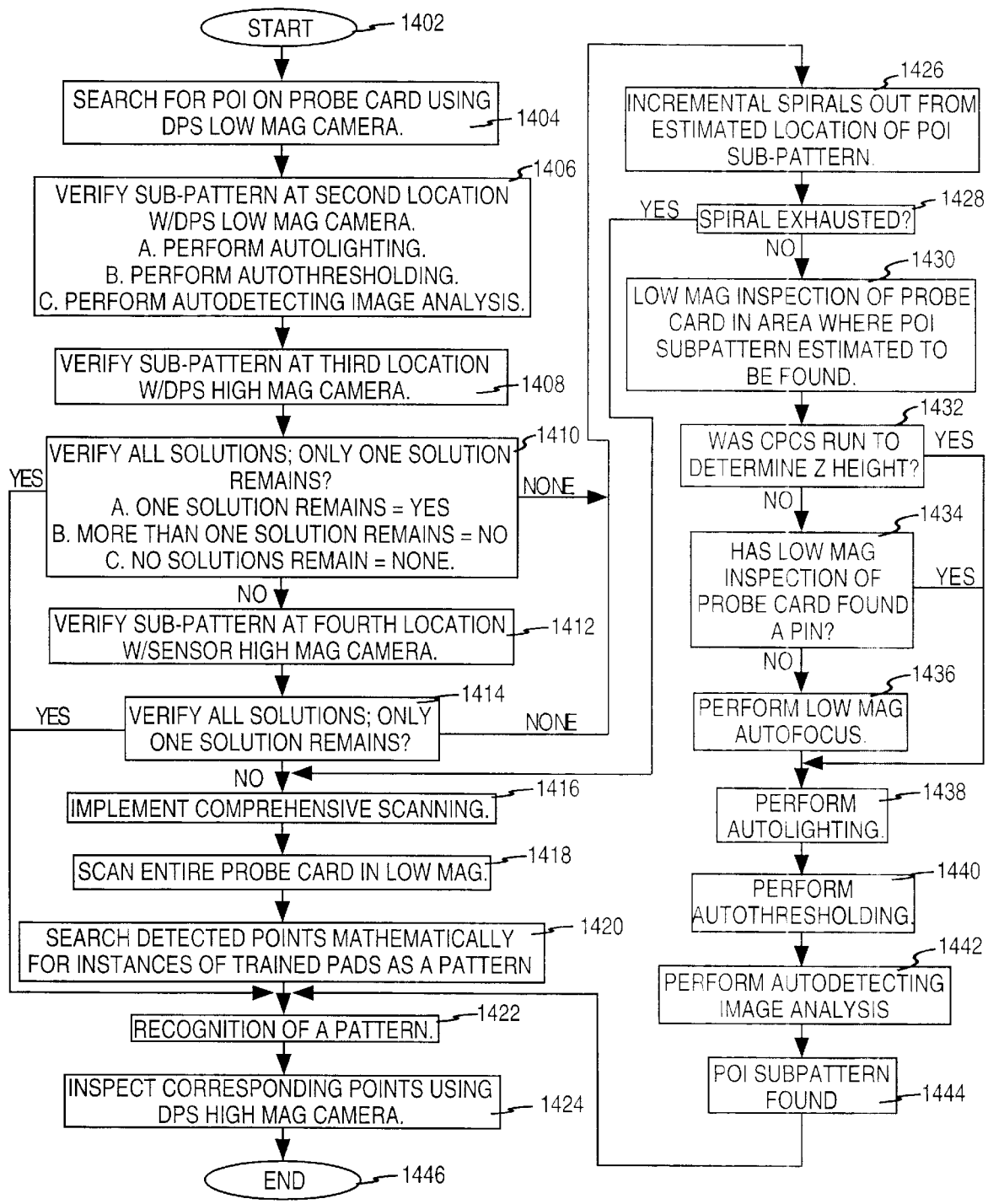
FIG. 14 illustrates a flow diagram for validating a pattern of interest at another location on a probe card using the DPS low magnification camera.

FIG. 14 illustrates a flow diagram for validating a pattern of interest at another location on a probe card using the DPS low magnification camera. The flow diagram starts at block 1402. Operation continues at block 1404, at which the DPS prober searches for a pattern of interest among the probe card pins using the DPS low magnification camera. When the DPS prober has recognized a subpattern operation continues at block 1406, at which the prober will verify the subpattern at a second location with the DPS low magnification camera. This verification is performed using the aforementioned autolighting, autothresholding, and autodetecting image analysis algorithms. The second location should be a maximum distance from the original pattern to minimize error and angular calculation. The DPS prober will then verify using triangulation and high magnification.

Operation continues at block 1408, at which the DPS prober will verify the sub-pattern at a third location using the DPS high magnification camera. At any stage at which the DPS prober is attempting verification of a subpattern, it is possible that there may be more than one solution. The DPS prober will attempt to verify all solutions until only one remains. In attempting to verify all solutions, the DPS prober will produce one of three possible results: one solution remains; more than one solution remains; and no solutions remain. The remainder of the description of this flow diagram for validating a pattern of interest will describe the validation flow for each of these three possible DPS prober results.

Operation continues at block 1410, at which the DPS prober verifies all solutions. When only one solution remains as a result of the DPS prober solution verification, operation continues at block 1422, at which the DPS prober recognizes a pattern. Operation continues at block 1424, at which the DPS prober inspects corresponding points using the DPS high magnification camera. The flow diagram ends at block 1446.

If no solutions remain as a result of the DPS prober solution verification, operation continues at block 1426, at which incremental scanning is implemented. Incremental scanning in one embodiment analyzes the trained pads for a subpattern and inspects in low magnification where it expects to find the subpattern. It will then spiral search out from the estimated location of the subpattern of the pattern of interest to the limit of the positional tolerance until it recognizes a subpattern which is not necessarily the original sub-pattern. Following incremental spirals out from the estimated location of the pattern of interest, operation continues at block 1428, at which a determination is made whether the spiral is exhausted, or whether the spiral has reached the limits of the die.

If the DPS prober determines that spiraling is exhausted, operation continues at block 1416, at which the DPS prober implements comprehensive scanning. Using comprehensive scanning, operation continues at block 1418, at which the DPS prober scans the entire probe card area using the DPS low magnification camera. Operation continues at block 1420, at which the DPS prober will search all detected points mathematically for instances of the trained pad as a pattern. Operation continues at block 1422, at which the DPS prober recognizes a pattern. Following pattern recognition, the DPS prober inspects corresponding points using the DPS high magnification camera, at block 14241. The flow diagram ends at block 1446.

If the DPS prober determines that spiraling is not exhausted at block 1428, operation continues at block 1430, at which a low magnification inspection of the probe card is accomplished by the DPS camera in an area of the probe card where the sub-pattern of the pattern of interest is estimated to be found. Operation continues at block 1432, at which the DPS prober determines whether CPCS was run to determine the Z height. If the CPCS was run as described with reference to FIG. 8, operation continues at block 1438. If the CPCS was not run, operation continues at block 1434, at which it is determined whether the low magnification inspection of the probe card has located a pin. If a pin has been located, operation continues at block 1438. If no pin has been located, operation continues at block 1436, at which a low magnification autofocus is performed. Following the low magnification autofocus, the DPS prober performs autolighting to optimize the visibility of the pins, at block 1438. When a light level is found that produces, in one embodiment, the maximum contrast and the imaging, operation continues at block 1440, at which autothresholding is performed to separate the dark background and the bright pins. Following the automatic setting of a threshold, operation continues at block 1442, at which an autodetecting image analysis is performed to determine the centeriods of the probe card pin images. The autodetect algorithm, following automatic adjustment of light threshold and focus, performs a blob analysis to determine if something is in the image. When the DPS prober algorithms have determined that something is in the image and the image is possibly that of pins, then the image is compared against the subpattern of the pattern of interests and verified against that pattern. If the DPS determines that it has recognized a pattern of the subpattern of interest, at block 1444, operation continues at block 1422, at which the DPS prober recognizes a pattern. Operation continues at block 1424, at which the DPS prober inspects corresponding points using the DPS high magnification camera. The flow diagram ends at block 1446.

If more than one solution remains upon verification of a solution at block 1410, operation continues at block 1412, at which the DPS prober will verify the subpattern at a fourth location using the DPS high magnification camera. Operation continues at block 1414, at which the DPS prober again verifies all solutions. If only one solution remains then operation continues at block 1422 as previously described. If no solution remains then operation continues at block 1426 as previously discussed. If more than one solution remains then operation continues at block 1416 as previously discussed.

Using comprehensive scanning, operation continues at block 1420, at which the DPS prober scans the entire probe area using the DPS low magnification camera. Operation continues at block 1422, at which the DPS prober will search all detected points mathematically for instances of the trained pad as a pattern. Operation continues at block 1424, at which the DPS prober recognizes a pattern. Operation continues at block 1426, at which the DPS prober inspects corresponding points using the DPS high magnification camera. The flow diagram ends at block 1428.

Figure 15:
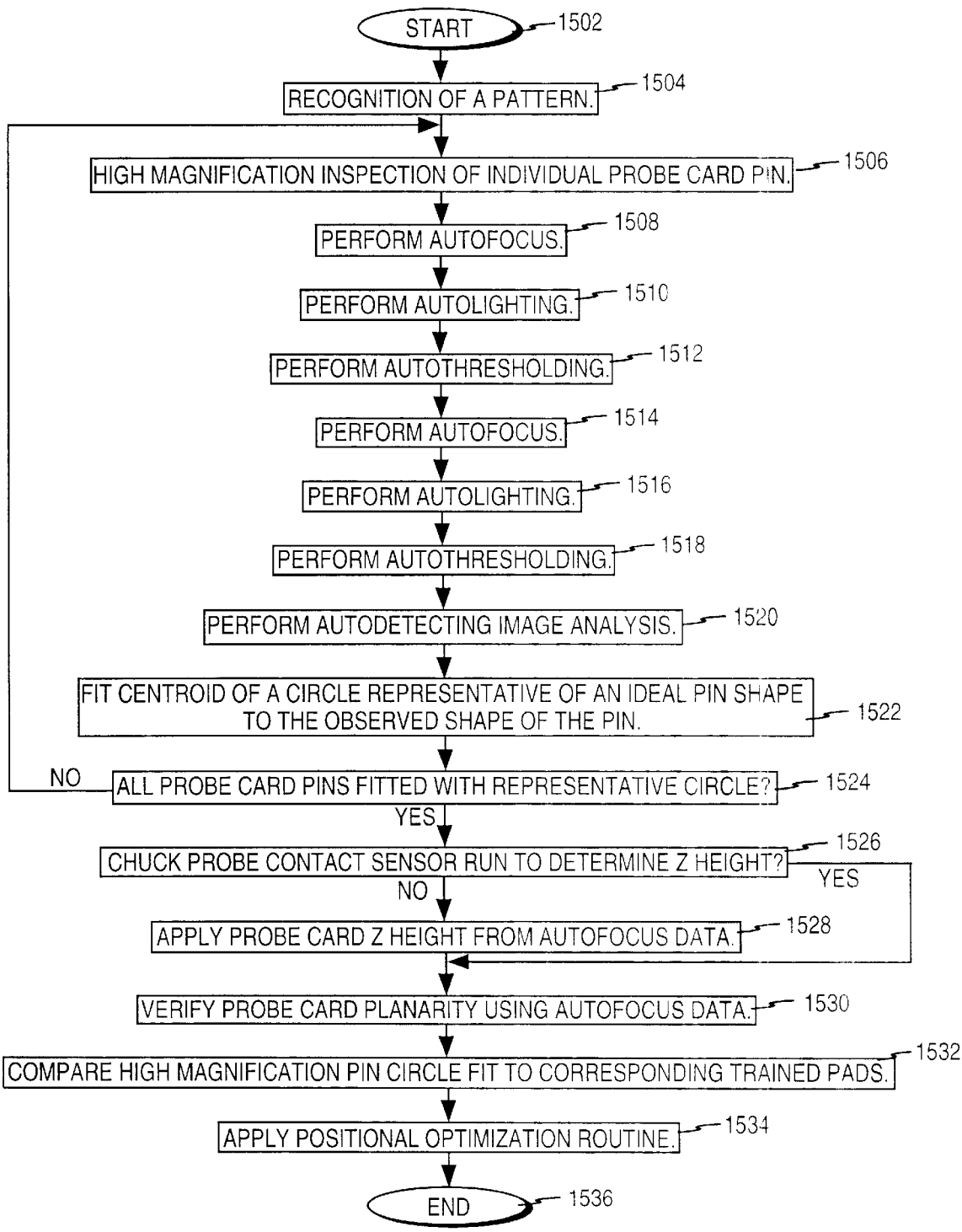
FIG. 15 illustrates a flow diagram for inspecting corresponding points using the DPS high magnification camera.

FIG. 15 illustrates a flow diagram for inspecting corresponding points using the DPS high magnification camera. The flow diagram starts at block 1502. Operation continues at block 1504, at which the DPS prober recognizes a pattern. Operation continues at block 1506, at which the DPS prober conducts a high magnification inspection of the individual probe card pins. At block 1508, the previously described autofocus algorithm is executed. Operation continues at block 1510, at which the previously described autolighting algorithm is executed in order to find a light level that produces the maximum contrast in the pin image. Operation continues at block 1512, at which the DPS prober performs autothresholding. At block 1514, autofocus is repeated to further refine the image. Autolighting and autothresholding are also repeated at blocks 1516 and 1518, respectively. Operation continues at block 1520, at which the DPS prober performs autodetecting image analysis to determine the centeriods with the probe card images. The details of the autolighting, autothresholding, autofocus, and autodetecting steps are as previously set forth herein.

Figure 16:
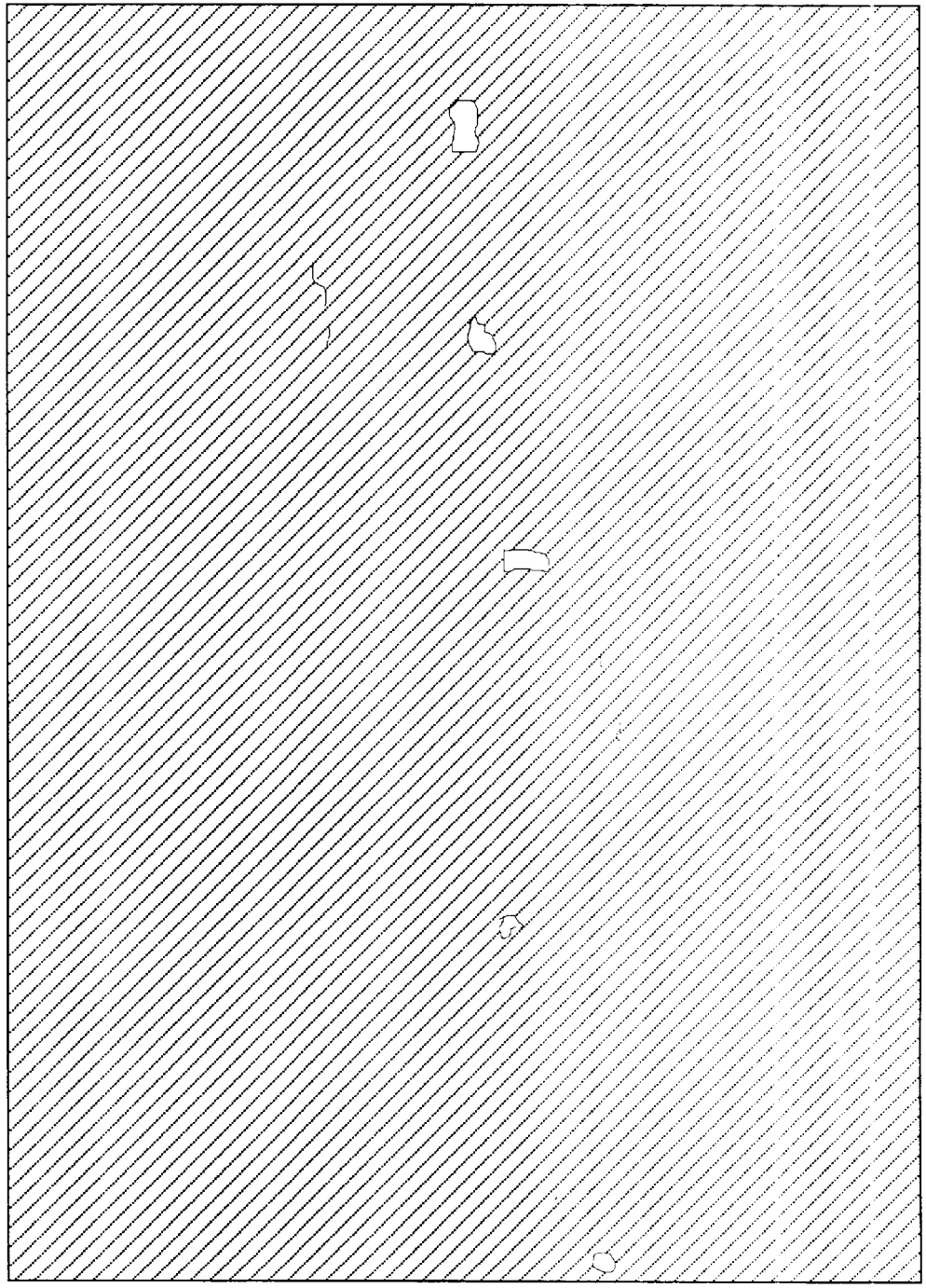
FIG. 16 illustrates a representative image from the DPS high magnification camera.

FIG. 16 illustrates a representative image from the DPS high magnification camera. This image was obtained using the dark field vision in which oblique lighting was used and the probe pins, appear white against a dark background. The ideal pin shape of the embodiment of the prober set forth herein is that of a circle. The high magnification image of FIG. 16 illustrates that the observed shape of the pins is not necessarily circular. As a result, referring again to FIG. 15, operation continues at block 1522, at which an embodiment of the prober fits a circle representative of an ideal pin shape to the observed shape of a pin and determines a centroid for the circle which has been so fitted.

Figure 21A:
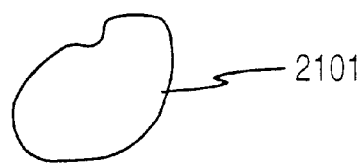
FIG. 21a, 21b, and 21c show respectively an image of a contact electrode (e.g. a pin on a probe cord), a fitted shape 2102 which has been fitted to the image 2101, and another fitted shape 2105 which has been fitted to the image 2106.
Figure 21B:
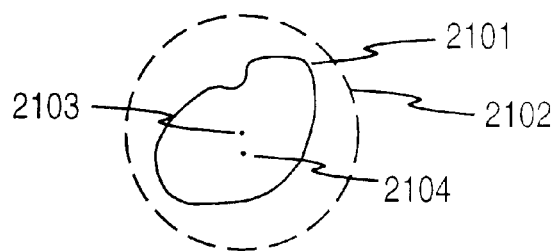
Figure 21C:
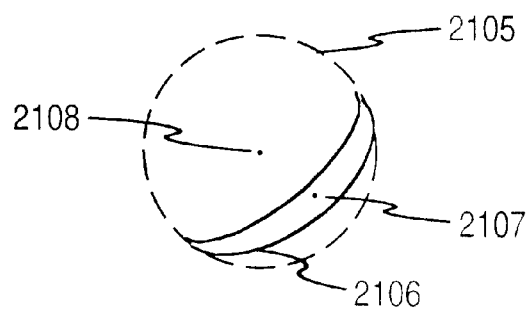

It will be appreciated that the shape which is fit to the contact electrodes (which are designed to make electrical contact to the pads) will normally be a shape which matches or conforms substantially to the shape of a normally formed contact electrode (e.g. pin on the probe card). If the shape of the contact electrode is elliptical, then the shape which is fit is also elliptical. Thus, numerous alternative shapes (e.g. square, rectangle, elliptical, etc.) exist and may be used with the invention. Also, the centroid of the shape, after the shape has been fitted to a detected contact electrode of an image, is normally a "center of mass" of the object. However, in a manner which is consistent with the invention, the centroid may be any geometric parameter which increases the likelihood that a plurality of contact electrodes will not be misaligned with their corresponding pad when the contact electrodes are brought into physical contact with the wafer which is being probed. FIGS. 21a, 21b, and 21c illustrate the process of fitting a shape, such as circles 2102 or 2105 to an image of a contact electrode, such as images 2101 or 2106, and determining a centroid of the fitted shape. As shown in FIG. 21a, the image of a contact electrode 2101 is not a perfect circle even though the normally formed ("ideal") contact electrode (assuming its shape is perfectly formed in the manufacturing process) is a circle. This can arise for a number of reasons, including poor lighting or image capture or the contact electrode's shape is actually misformed. FIG. 21b shows the result of fitting a circle to the image 2101 to thereby produce the fitted shape 2102 having a centroid 2103 which was determined in the process of the invention. In one embodiment, the centroid so determined is the center of the fitted circle. Note how the position of centroid 2103, which was determined according to the invention, deviates from the centroid 2104 of the image 2101. FIG. 21c illustrates an advantage of the present invention by showing how large the deviation, between the centroid 2108 of the fitted shape 2105 and the centroid 2107 of the contact electrode's image 2106, may be. By using the centroid 2108, this contact electrode will still be properly aligned with its corresponding pad and the other contact electrodes will remain aligned with their corresponding pads. If the centroid 2107 were used, it is likely that other contact electrodes will not be properly aligned when probing occurs.

In fitting a circle to a detected pin, the edge pixels of a blob are extracted. These edge pixels represent the perimeter points. Assuming that the original pin's shape is circular, the maximal distance can be found between any two perimeter points in the edge pixels. This maximal distance represents the chord of the imaged pin circle. The circle fit algorithm can be extended to ellipses, where a maximal chord is located and then an orthogonal minimal chord is located near the halfway point of the maximal chord, or circle center as determined by the maximal chord.

After fitting a circle to a pin, operation continues at block 1524, at which the DPS prober determines whether all probe card pins have been fitted with a representative circle. If all probe card pins have not been fitted with a representative circle, operation returns to block 1506, and the steps of blocks 1506 through 1522 are repeated on another pin. If all probe card pins have been fitted with a representative circle, operation continues at block 1526. If the CPCS was run, operation continues at block 1530, at which probe card planarity is verified using autofocus data. If the CPCS was not run, operation continues at block 1528, at which the probe card Z height determined from the autofocus data is applied. Operation continues at block 1530, at which probe card planarity is verified using autofocus data. The DPS prober then compares the high magnification pin circle fit to corresponding trained pads, at block 1532. A positional optimization routine is applied, at block 1534. The flow diagram ends at block 1536.

The APTPA provides optimal probe to pad contact using two algorithms, a correlation algorithm and a position optimization algorithm. Regarding the optimal positioning algorithm, and the associated probe to pad contact theory, it is clear that the limiting factor is the pad boundaries: probe travel and probe marks are restricted to remain within the pad boundaries. Furthermore, this limiting factor is local to each pad with global considerations not particularly important; that is, even if all but one pin is perfectly centered on the center of the pad, a single stray pin violating the pad boundary will make the entire touchdown invalid. Consequently, the quality of the probe to pad contact will only be as good as the least quality pad.

Figure 17:
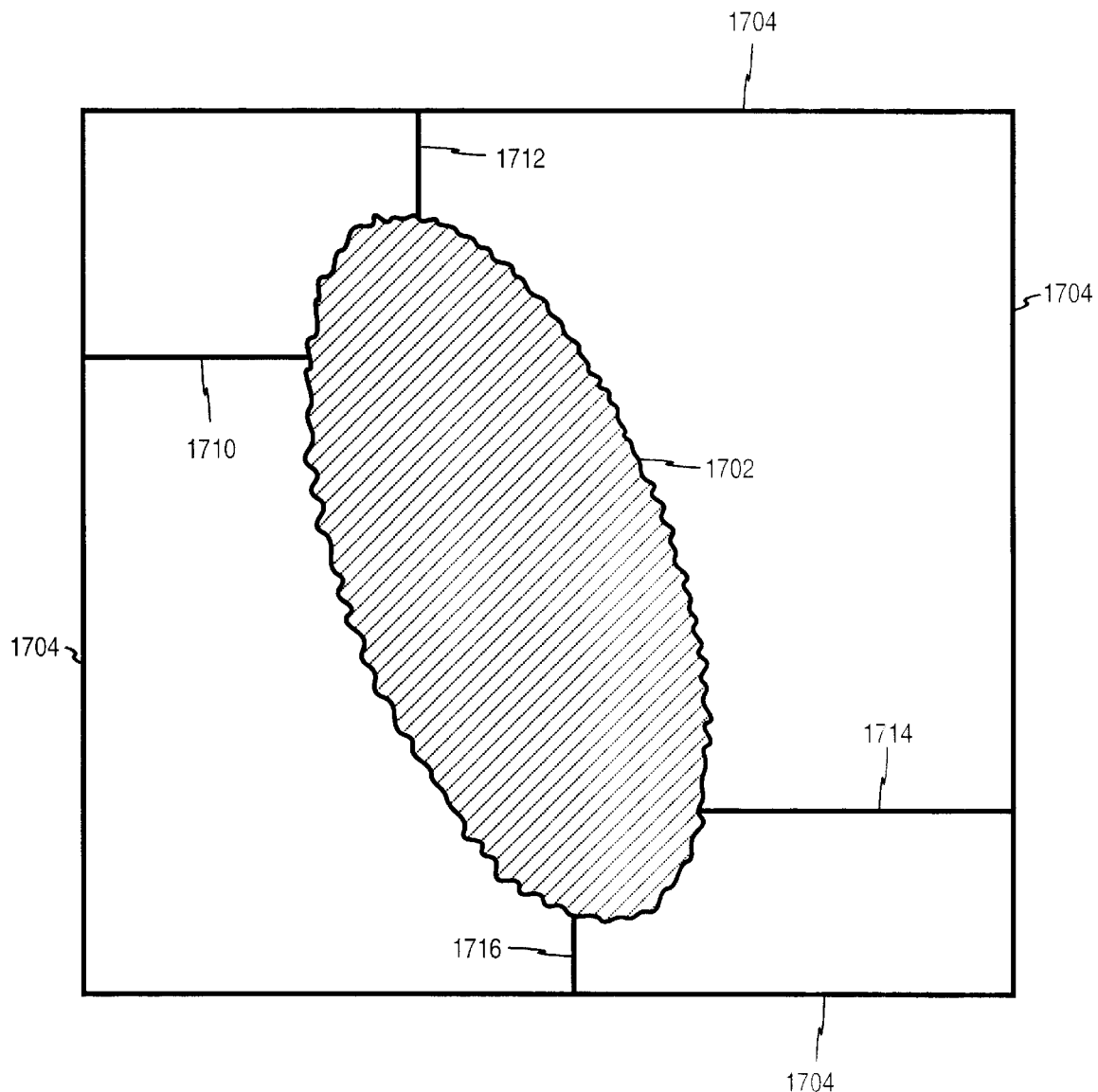
FIG. 17 illustrates a probe contact area, or probe mark, within a pad boundary.

With this in mind, it first becomes instructive to analyze a single pad. FIG. 17 illustrates a probe contact area 1702, or probe mark, within a pad boundary 1704. The pad is considered to be the area formed by the intersection of four open half planes 1704. The minimum distance 1710, 1712, 1714, and 1716 of the probe mark to any one of the four half plane boundaries 1704 represents the relative safety of the mark violating that particular boundary; the larger the distance, the safer the mark. Consequently, the minimum of the four distances represents the safety of the probe mark with respect to the entire pad. This is referred to as the quality of the probe mark. This is written as:

$$Q_i = \min_{j=1...4} \|m_i, b_j\|$$

where $Q_i$ is the quality of the ith mark, $m_i$ is the ith mark, and $b_i$ are the four boundaries.

Given this quality, the quality of the entire die (or array for the case of multiple die) can now be measured. Because the global consideration is only as good as the worst individual pad, it becomes clear that:

$$Q_T = \min_i (Q_i)$$

where i ranges over all marks/pads in the die. Consequently, the goal of probe to pad alignment is to maximize the values of the touchdown quality on any given die. The parameters that are allowed to be modified are the offset and rotation. This allows a consideration of the transformed quality of a particular mark, where the transform is relative to the die's reference location:

$$T(Q_i) = \min_{j=1...A} \|T(m), b_j\|$$

where T is the linear transform described by a rotation, $\Psi$, with an offset X and Y added:

$$T\begin{pmatrix} x \\ y \end{pmatrix} = \begin{pmatrix} x\cos\Psi - y\sin\Psi + X \\ x\sin\Psi + y\cos\Psi + Y \end{pmatrix},$$

and it is assumed that if the point $p_i$ of $m_i$ was the point that defined the distance to $b_i$ then $T(p_i)$ also defines the distance. This is valid for small values of the angle.

Analogously, the transformed quality of the die's (or array's) touchdown can be defined as:

$$T(Q_T) = \min_i (T(Q_i))$$

Thus, the goal of probe to pad alignment can now be defined as the maximization of the transformed quality over the space of all possible transformations, that is, values of rotation and offset.

$$\text{Goal: } \max_{\Psi,X,Y} (T_{\Psi,X,Y}(Q_T))$$

It is noted that the aforementioned goal is immediately cast as a maxi-min problem (or minimax after a simple inversion of the sense of quality), and the various techniques of linear and non-linear optimization are considered. Naturally, there is a desire to avoid non-linearity, and this is easily accomplished by using the assumption that the angle psi is small enough to allow use of the first order approximations to the sine and cosine.

It is now written for each pad:

$\zeta = b_{x^+} - (X_{x^+} \Psi y_{x^+} + X)$
$\zeta = (X_{x^-} \Psi y_{x^-} + X) - b_{x^-}$
$\zeta = b_{y^+} - (y_{y^+} + \Psi x_{y^+} + Y)$
$\zeta = (Y_{y^-} + \Psi x_{y^-} + Y) - b_{y^-}$
$\zeta > 0$ where (for example) $b_{x^+}$ indicates the vertical boundary in the positive direction, $X_{x^+}$ indicates the x component of the point which defines the distance to the corresponding boundary, and z represents the globally identified mark to boundary distance variable. We now separate variables into positive and negative parts for Simplex normal form and obtain the optimization problem of maximizing $\zeta$ given the tableau (ith piece) of FIG. 18. This is solved by an application of the Simplex algorithm. Note that infeasibility of the problem simply means that $\zeta < 0$ for all possible combinations of $<\Psi, X, Y> \in \Omega$; this in turn is interpreted as meaning that the probe card as presented is not alignable.

However, there is a slight complication in this solution: although the two boundary distances for each pad in each axes (that is, the two x and the two y distances) are tightly coupled meaning that if one is increased, the other is decreased, the distances between the two axes are only very loosely coupled by rotation. This means that the Simplex will find a solution that maximizes the worse case distance, but will not consider an improvement along the orthogonal axes to the axes that has the worst case distance. This is rectified by introducing the secondary quality of a touchdown or a mark. This is defined as the minimum pad to mark distance in the orthogonal axes to the axes that has the worst case distance that defines the primary quality. This is maximized globally across the die for the given solution by considering a translation in the orthogonal axes only. The maximization is done by centralizing the worst case distance in each direction. This algorithm is also applied in the system on marks, pins, and on virtual marks which are single points or points that are developed through extrapolation into more mark like elements.

Regarding the correlation algorithm, it was noted that the collection of marks were assumed to be measured relative to their respective pads. With the DPS prober's virtual pads there are no respective pads. In the normal operation of inspection on a device with pads, it is assumed that a mark can be found within a pad location. While it is true that virtual pads are extrapolated in space, it is not a priori evident which mark or pin to measure against which pad. Hence it becomes necessary to apply some form of initial mark to pad correlation algorithm on the DPS prober data.

In essence, the problem of correlation is one of pattern matching. That is, given a collection of known locations that comprise some pattern, referred to as the template, and a collection of observation points, a unique occurrence of the pattern must be found within the observation (more than one or no occurrence of the pattern may occur, in which case an error should be noted). Furthermore, a one-to-one correspondence has to be built between the observation points that comprise the pattern occurrence and the points within the pattern. The pattern itself can occur at various offsets and is potentially rotated with respect to template's expected orientation.

The issue of the one-to-one mapping requirement mandates an extension to normal pattern searching techniques because the search is for more than a simple pattern instance. Also, the problem is highly discrete because the basic image is composed of a collection of separated small blobs or points of one color, either black or white, against a background of the opposite color with little gradation. Therefore, a relief histogram of the image would be very nearly a characteristic or step function. Additionally the problem is highly sparse because both the image elements and the template elements are separated by large distances in comparison with the respective sizes of the elements. These latter two considerations eliminate any easy application of standard pattern search techniques using masks or gradients. Indeed, most techniques normally assume that the problem of general pattern recognition is in actuality a continuous problem with the discrete nature of pixels and grey levels arising from natural approximations; and quantization which are expected to arise in any real world problem.

The previous discussion assumes to a certain extent that the entire image space has been examined before the pattern recognition is attempted. While this simplifies the problem of recognition, it has a detrimental effect on the speed of the operation since data acquisition is the bottleneck of the process. Hence, it becomes imperative that an incremental approach be used; that is, an approach where the image space only partially acquired and the resultant partial pattern recognition algorithm then commands the next partial acquisition of the image space. This then continues until the pattern is fully recognized.

In the following, a precise discussion of the non-incremental correlation problem is presented. A template of n points is provided, $T = \{t_i\}_{i=1 \ldots n}$, which may be considered "ideal" locations, relative to some abstract origin of some possible pattern instance. An image space is next provided, $\Pi = \{P_k\}_{k=1 \ldots m}$, in which is embedded a collection of instances of T at various angles and offsets, say $\{T_j, \Theta_j, v_j\}_{j=1 \ldots q}$. Furthermore, each point $t_{ij}$ of realized pattern instances (i.e. that corresponds to a particular point $P_k$), is perturbed by some amount, so that if $S_{\Theta,v}$ is the transform describing a rotation by $\Theta$ and an offset by $v$, then: $P_k = S_{\Theta j, vj}(t_{ij}) + \epsilon_{ij} = S_{\Theta j, vj}(t_{ij} + S^{-1}_{\Theta j, vj}(\vec{\epsilon}_{ij})) = S_{\Theta j, vj}(t'_{ij})$ where $\vec{\epsilon}_{ij}$ is some small, but significant, deviation from the ideal.

The problem then, is twofold. First, find each realized pattern instance with associated position combination, $\{T_j, \Theta_j, v_j\}$. Second, associated with each realized pattern instance, develop a mapping, $\phi_j: T \to \Pi$ where $\phi_j(T_i) = P_k \Leftrightarrow S_{\Theta j, vj}(t'_{ij}) = P_k$.

Additionally there are three considerations. First, the realized pattern instances need not be complete; that is, there may be missing points in the realized instance. It is assumed that at least 50% of the pattern is present in any realized instance. Second, it is assumed that the space, T, is such that, under a reasonable range of values for $\Theta$ and $\vec{\epsilon}_{ij}$, false realizations will not be generated at invalid angles due to rotational self-quasi-similarity due to allowances made for the $\vec{\epsilon}_{ij}$ variation. Third, it may be assumed that space $\Pi$ is sparse and discrete within a global image space and that T is also sparsely defined.

The approach chosen to solve this problem from the number of techniques available is the template self-referential approach-localization with sub-template optimization. This approach has seven steps which are now described. First, build the space $\hat{T}_{trel}=\{t_1-t:t_1 \in T\}$. Chose a particular element $\hat{t} \in \hat{T}_{trel}$ Generally, it is best if this is chosen so that $$\|\hat{t}\|$$

is maximized. Second, scan each point $P_1 \in \Pi$ that is in a possible range to be at the terminus of t. Scan through the remaining points to establish the subsequent points $P_2 \in \Pi$ so that if $\hat{P}=P_1{}^-P_2$ we have. that $$\|\hat{p}-\hat{t}\| \leq \tau$$

and $$\left|\frac{\hat{p}\cdot\hat{t}}{\|\hat{p}\|\|\hat{t}\|}\right| \leq \vartheta.$$

Third, scan $\Pi_{p1} \subseteq \Pi$ (one frame) for points. If there are no points, then perform a larger scan until the entire expected range of t is exhausted. If no points are found, there is a failure. Fourth, within the collection of frames observed for each point (as an attempted representative of t), determine if there are any expected points $\hat{t}_i \in \hat{T}_{trel}$. If there are points search for corresponding $P_i \in \Pi$ within the already scanned frames. If the search fails for all such predicted points, continue with the third and fourth steps until the entire expected location for each presumed representative of t points at the expected range of t is exhausted, after which there is a failure. Fifth, proceed to the sub-template second point and acquire the image at its expected location for each presumed representative of t. Points at the expected location will yield an angle averaged location if second points were not found at the fourth step. Failure to find the sub-template second point mandates continuing with the third through fifth steps until the entire expected range of t is exhausted after which there is a failure. Sixth, as an extension, before the comprehensive scan, it is possible to choose additional points chosen from relative template; i.e. $\hat{t}_1 \in \hat{T}_{trel}$, which would form a basis for a preliminary scan rather than a large scan of the entire template. Seventh, if there are sufficient points remaining in $\Pi$ after completion of the procedure, then it is necessary to repeat the first and second steps using a different base template element and/or difference base relative template elements.

The APTPA has a vision interface which consists of several basic functions. A first function finds all blobs (for low magnification) in a frame and returns positions of centroids and areas. A second function finds all blobs (for low or high magnification) in a frame and returns positions of centroids and areas sorted by distance to center. A third function performs a virtual pad inspection of a mark or pin in high magnification. A fourth function performs an auto-focus (in low or high magnification) measurement on the current frame. This is used only with the DPS prober in conjunction with Z finding.

The DPS prober performs two types of scanning, comprehensive scanning and incremental scanning. Regarding comprehensive scanning, the basic scanning algorithm occurs with the sensor camera when auto focus is not in use. It has a high performance overhead as it requires a great number of frames to be inspected in low magnification. The scanning algorithm is quite simple: inspect an entire region in low magnification and report all blobs found. The region is inspected with a serpentine method and uses overlapping frames to ensure that nothing is missed.

Regarding the incremental scanning, which works best when a good sub-pattern can be extracted from the total set of trained pads, an algorithm combines the aspects of scanning for blobs with the pattern recognition. This is done by considering sub-patterns of the total pattern;

the basic idea is to search for a sub-pattern that fits in the area that has been scanned so far. Once this is done, the sub-pattern is validated as the correct representative of the entire pattern. The approach used in one embodiment of the present invention is the incremental template self-referential approach using sub-templates. This approach ha', six steps which are now described.

The first step is to build the space $\hat{T}_{trel}=\{t_1-t:t_1 \in T\}$. Chose a particular element $\hat{t} \in \hat{T}_{trel}$. Generally, it is best if this is chosen so that $$\|\hat{t}\|$$

is maximized. Second, determine the expected location $P_1 \in \Pi$, where it is expected to find t. Third, scan $\Pi_{p1} \subseteq \Pi$ (one frame) for points. If there are no points, then perform a larger scan until the entire expected range of t is exhausted. If no points are found, there is a failure. Fourth, within the collection of frames observed for each point (as an attempted representative of t), determine if there are any expected points $\hat{t}_i \in \hat{T}_{trel}$. If there are points, search for corresponding $P_i \in \Pi$ within the already scanned frames. If the search fails for all such predicted points, continue with the third and fourth steps until the entire expected location for each presumed representative of t points at the expected range of t is exhausted, after which there is a failure. Fifth, proceed to the sub-template second point and acquire the image at its expected location for each presumed representative of t. Points at the expected location will yield an angle averaged location if second points were not found at the fourth step. Failure to find the sub-template second points mandates continuing with the third through fifth steps until the entire expected range of t is exhausted, after which there is a failure. Sixth, repeat the fifth step with angle for the sub-template third point. If more than one sub-template is identified in the image, continue with fourth and subsequent points. Once there is a fix on one subtemplate, the image can be acquired for all remaining points and then a search run for the remainder of the pattern within the completed scan. At all stages, the image frames are optimized to include as many expected locations per frame as possible.

In selecting the optimal positioning algorithm the limiting factor to be considered with respect to probe to pad alignment is the pad boundaries; probe travel and probe marks are restricted to remain within the pad boundaries. Furthermore, this limiting factor is local to each pad with global considerations not particularly important. That is, if only one pin out of many violates the pad boundaries, then the entire touchdown is invalid. Consequently the quality of the entire probe to pad alignment is only as good as the least quality pad.

With this in mind the pad area is defined as the intersection of four open half planes. The minimum distance to any one of the four half planes represents the relative safety of the mark violating the particular boundary (i.e. the larger the distance to a boundary the safer the situation is with respect to that boundary). The minimum of such distances is then evaluated across the entire array of pins. This minimum defines the quality or safety of the alignment, with the goal being to maximize this minimal distance within the space of all possible rotations and translations.

When the linear approximations to the triginometric functions are used the problem becomes easily cast as the maximin linear programming problem. The problem is rather easily transformed into simplex normal form and a straight forward application of the Simplex algorithm will result in a solution. Because the application in the simplex treats the two axes equally the algorithm will find an answer for the worst case in one axes but will only improve the other axes to the level of the worst case axes. Consequently the orthogonal axes to the worst case axes is further optimizing through a shift that centralizes the worst case distance in each direction.

Figure 19:
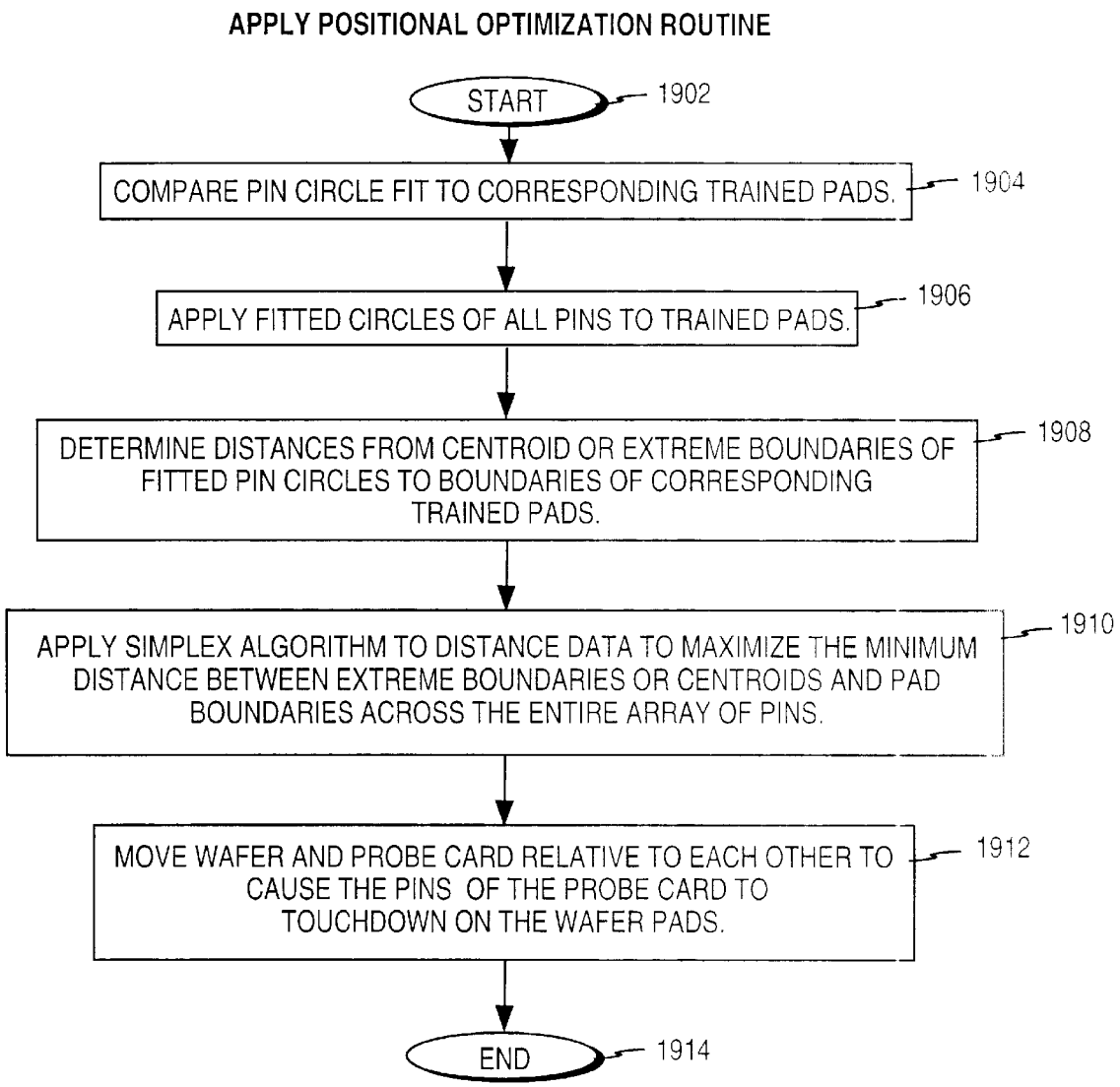
FIG. 19 illustrates a flow diagram for applying the positional optimization routine to DPS data to provide final positioning data.

FIG. 19 illustrates a flow diagram for applying the positional optimization routine to DPS data to provide final positioning data. The flow diagram starts at block 1902. Operation continues at block 1904, at which the DPS prober compares high magnification pin circle fit to corresponding trained pads. Operation continues at block 1906, at which the DPS prober applies fitted circles of all pins to trained pads. Operation continues at block 1908, at which the DPS prober determines distances from a centroid or the four extreme boundaries of each fitted pin circle to the boundaries of the corresponding trained pads. Operation continues at block 1910, at which the DPS prober applies the Simplex algorithm to the distance data. A processing system, such as shown in FIG. 20, may perform this algorithm by using a computer program stored in a computer readable medium (e.g. mass storage), or a disk or CD-Rom in the system. The Simplex algorithm maximizes the minimum distance between extreme boundaries or centroids and the pad boundaries across the entire array of pins within the space of all possible rotations and translations. At block 1912, the DPS prober moves the wafer and the probe card relative to each other to cause the pins of the probe card to touchdown on the pads on a die of the wafer. The flow diagram ends at block 1914.

Thus, a method and an apparatus for automatically aligning a wafer prober to the bonding pads of an IC device have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for accurately positioning a plurality of contact electrodes relative to a plurality of pads, the method comprising:
   locating a pattern of contact electrodes at a first location using a first image of the plurality of contact electrodes;
   fitting a shape representative of a contact electrode surface to at least one of the plurality of contact electrodes and determining a centroid of said shape;
   comparing the position of the centroid to a position of at least one of the plurality of pads;
   moving at least one of the plurality of pads and the plurality of contact electrodes relative to each other to a position for contact between the plurality of contact electrodes and the plurality of pads.

2. The method of claim 1, further comprising validating the pattern of contact electrodes at a second location using at least one of the first image and a third image and wherein said fitting uses a second image of at least one of said contact electrodes, said second image being magnified relative to said first image.

3. A method for accurately determining the location of each of a plurality of contact electrodes, the method comprising:
   searching for a pattern of contact electrodes at a first location using a first level of magnification;
   inspecting each of the plurality of contact electrodes using a second level of magnification;
   fitting a shape of a contact electrode surface to at least one of the plurality of contact electrodes and determining a centroid of said shape.

4. The method of claim 3, further comprising:
   enhancing a first image of the pattern of contact electrodes;
   validating the pattern of contact electrodes at a second location;
   enhancing a second image of each of the plurality of contact electrodes and wherein said searching and said inspecting are performed with a camera having a plurality of levels of magnification.

5. A method for imaging a plurality of contact electrodes, the method comprising:
   acquiring an image of the plurality of contact electrodes using a first level of magnification;
   acquiring an image of each of the plurality of contact electrodes using a second level of magnification;
   automatically adjusting a light level to distinguish between a plurality of pixels of each of the plurality of contact electrodes and a plurality of pixels of a background;
   automatically focusing the image to determine the shape of each of the plurality of contact electrodes; and
   fitting a representative shape to the shape of each of the plurality of contact electrodes and determining a centroid for each representative shape.

6. The method of claim 5, wherein automatically adjusting a light level is performed while using the first and the second levels of magnification.

7. The method of claim 5, wherein automatically focusing the image is performed while using the first and the second levels of magnification.

8. A method for accurately positioning a plurality of contact electrodes and a plurality of pads relative to each other, the method comprising:
   fitting a shape representative of a contact electrode surface to each of a plurality of contact electrodes;
   determining a centroid of the fitted shape for each of the plurality of contact electrodes to determine a plurality of centroids corresponding to a plurality of pads;
   determining a plurality of distances relative to a position associated with each of the plurality of centroids and a plurality of boundaries of each of the plurality of pads;
   maximizing a minimum distance of the plurality of distances;
   moving at least one of the plurality of pads and the plurality of contact electrodes relative to each other to a position for contact between the plurality of contact electrodes and the plurality of pads.

9. The method of claim 8, wherein maximizing a minimum distance of the plurality of distances is performed using a Simplex algorithm.

10. A method for viewing contact electrodes on a probe module located in a wafer prober, said method comprising:

automatically adjusting a light level to distinguish between a plurality of pixels of each of the plurality of contact electrodes and a plurality of pixels of a background;

viewing said contact electrodes by using a camera having a first magnification;

fitting a representative shape to the shape of each of the plurality of contact electrodes and determining a centroid for each representative shape.

11. A method as in claim 10 wherein said first magnification is a high magnification.

12. A method as in claim 10 wherein said camera comprises a first part and a second part optically coupled to the first part, wherein said second part houses heat sensitive components.

13. A computer readable medium storing executable computer program instructions which, when executed by a processing system, cause the processing system to perform a method comprising:

locating a pattern of contact electrodes at a first location using a first image of a plurality of contact electrodes;

fitting a shape representative of a contact electrode surface to at least one of the plurality of contact electrodes and determining a centroid of said shape;

comparing the position of the centroid to a position of at least one of a plurality of pads;

moving at least one of the plurality of pads and the plurality of contact electrodes relative to each other to a position for contact between the plurality of contact electrodes and the plurality of pads.

14. A computer readable medium storing executable computer program instructions which, when executed by a processing system, cause the processing system to perform a method comprising:

searching for a pattern of contact electrodes at a first location using a first level of magnification;

inspecting each of the plurality of contact electrodes using a second level of magnification;

fitting a shape of a contact electrode surface to at least one of the plurality of contact electrodes and determining a centroid of said shape.

15. A computer readable medium storing executable computer program instructions which, when executed by a processing system, cause the processing system to perform a method comprising:

acquiring an image of a plurality of contact electrodes using a first level of magnification;

acquiring an image of each of the plurality of contact electrodes using a second level of magnification;

automatically adjusting a light level to distinguish between a plurality of pixels of each of the plurality of contact electrodes and a plurality of pixels of a background;

automatically focusing the image to determine the shape of each of the plurality of contact electrodes;

fitting a representative shape to the shape of each of the plurality of contact electrodes and determining a centroid for each representative shape.

16. A computer readable medium storing executable computer program instructions which, when executed by a processing system, cause the processing system to perform a method comprising:

fitting a shape representative of a contact electrode surface to each of a plurality of contact electrodes;

determining a centroid of the fitted shape for each of the plurality of contact electrodes to determine a plurality of centroids corresponding to a plurality of pads;

determining a plurality of distances relative to a position associated with each of the plurality of centroids and a plurality of boundaries of each of a plurality of pads;

maximizing a minimum distance of the plurality of distances;

moving at least one of the plurality of pads and the plurality of contact electrodes relative to each other to a position for contact between the plurality of contact electrodes and the plurality of pads.

* * * * *

UNITED STATES PATENT AND TRADEMARK OFFICE
CERTIFICATE OF CORRECTION

PATENT NO.  : 6,096,567  
DATED       : August 1, 2000  
INVENTOR(S) : Kaplan et al.

Page 1 of 1

It is certified that error appears in the above-identified patent and that said Letters Patent is hereby corrected as shown below:

<u>Title page,</u>  
Item [75] please add -- Timothy J. Boyle, Sunnyvale, --.

Signed and Sealed this

Twenty-fifth Day of September, 2001

Attest:

NICHOLAS P. GODICI  
*Acting Director of the United States Patent and Trademark Office*

*Attesting Officer*